US012078547B2

(12) United States Patent
Adams et al.

(10) Patent No.: US 12,078,547 B2
(45) Date of Patent: Sep. 3, 2024

(54) ETALON THERMOMETRY FOR PLASMA ENVIRONMENTS

(71) Applicant: Applied Materials, Inc., Santa Clara, CA (US)

(72) Inventors: Bruce E. Adams, Portland, OR (US); Samuel C. Howells, Portland, OR (US); Alvaro Garcia, Mountain View, CA (US); Barry P. Craver, Sunnyvale, CA (US); Tony Jefferson Gnanaprakasa, Mountain View, CA (US); Lei Lian, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 395 days.

(21) Appl. No.: 17/487,993

(22) Filed: Sep. 28, 2021

(65) Prior Publication Data

US 2023/0102821 A1 Mar. 30, 2023

(51) Int. Cl.
*G01J 5/58* (2022.01)
*H01J 37/32* (2006.01)
*H01L 21/66* (2006.01)

(52) U.S. Cl.
CPC ............ *G01J 5/58* (2013.01); *H01J 37/32522* (2013.01); *H01L 22/12* (2013.01); *G01J 2005/583* (2013.01); *H01J 2237/24585* (2013.01); *H01J 2237/334* (2013.01)

(58) Field of Classification Search
CPC ................. G01J 2005/583; H01J 2237/24585
See application file for complete search history.

(56) References Cited

U.S. PATENT DOCUMENTS

| 5,263,776 A | 11/1993 | Abraham et al. |
| 5,682,236 A | 10/1997 | Trolinger et al. |
| 2001/0026357 A1 | 10/2001 | Ota et al. |
| 2012/0084045 A1 | 4/2012 | Koshimizu et al. |
| 2013/0264316 A1 | 10/2013 | Li et al. |
| 2013/0314713 A1 | 11/2013 | Nagai |

(Continued)

FOREIGN PATENT DOCUMENTS

| KR | 20120001929 A | 1/2012 |
| WO | 2016073506 A1 | 5/2016 |

OTHER PUBLICATIONS

International Search Report and Written Opinion for PCT/US2022/042598 dated Dec. 27, 2022.

*Primary Examiner* — Walter H Swanson
(74) *Attorney, Agent, or Firm* — Patterson + Sheridan, LLP

(57) ABSTRACT

A method and apparatus for determining the temperature of a substrate within a processing chamber are described herein. The methods and apparatus described herein utilize an etalon assembly and a heterodyning effect to determine a first temperature of a substrate. The first temperature of the substrate is determined without physically contacting the substrate. A separate temperature sensor also measures a second temperature of the substrate and/or the substrate support at a similar location. The first temperature and the second temperature are utilized to calibrate one of the temperature sensors disposed within the substrate support, a model of the processes performed within the processing chamber, or to adjust a process parameter of the process performed within the processing chamber.

19 Claims, 13 Drawing Sheets

(56) References Cited

U.S. PATENT DOCUMENTS

| | | |
|---|---|---|
| 2015/0221535 A1 | 8/2015 | Nguyen et al. |
| 2017/0045689 A1 | 2/2017 | Zhang et al. |
| 2019/0141790 A1* | 5/2019 | Ito .................... H01L 21/67115 |
| 2020/0025631 A1 | 1/2020 | Howells et al. |

* cited by examiner

ETALON THERMOMETRY FOR PLASMA ENVIRONMENTS

BACKGROUND

Field

Embodiments of the present disclosure generally relate to temperature measurements in semiconductor processing chambers, and specifically to non-contact temperature measurements by heterodyning coherent radiation between two etalon-objects within or associated with the processing chamber.

Description of the Related Art

Temperature is a key parameter for semiconductor processing. Measurement of temperature of selected objects at various locations in a processing chamber and at various processing stages can be challenging. For example, temperature measurement of in situ semiconductor substrates offers significant challenges for traditional measurement technologies.

Current pyrometers estimate temperature by detecting thermal radiation. However, although current pyrometers may avoid surface-contact risks, pyrometers may be limited to high temperatures (e.g., >380° C.). The accuracy of current pyrometers may be limited due to emissivity variability (e.g., emissivity variability of surface patterns). Many new low temperature processes with complex film stacks are beyond the limits of accurate and repeatable radiation pyrometers.

Pyrometers are further limited when utilized in processes which include a plasma, such as plasma etching or plasma deposition. The plasma interferes with temperature measurements of the pyrometers by introducing noise and additional light which is not easily filtered from the pyrometer measurements. Contact temperature sensors are utilized to obtain more direct temperature measurement without variance caused by emissivity or noise from radiation sources within a processing chamber. However, contact temperature sensors are limited in response time and accuracy and often measure the temperature of substrate support adjacent to the substrate rather than the substrate itself.

Therefore, there is a need in the art for improved methods and systems for temperature measurement.

SUMMARY

The present disclosure generally relates to apparatus and methods for measuring temperature within a process chamber. In one embodiments, a method of sensing temperature suitable for use in a semiconductor processing chamber is described. The method includes passing a first light beam through a first etalon and passing the first light beam through a substrate disposed in the processing chamber. The substrate provides a second etalon. A reflected second beam and a transmitted second beam are generated from the first light beam after passing the reflected second beam through both of the first etalon and the second etalon. A fringe spacing is determined from an interference pattern of one of the reflected second beam or the transmitted second beam. A temperature of the substrate is determined based on the fringe spacing.

In another embodiment, a method of sensing temperature suitable for use in a semiconductor processing chamber is described. The method includes passing a first light beam through a first etalon and passing the first light beam through a substrate disposed in the processing chamber. The substrate provides a second etalon. One of the first etalon or the second etalon generates a reflected second beam and a transmitted second beam from the first light beam. The first etalon and the second etalon form an etalon assembly. A fringe spacing is determined from an interference pattern produced within one of the reflected second beam or the transmitted second beam of the etalon assembly. A temperature of the substrate is determined based on the fringe spacing. The temperature is provided to a controller of the processing chamber before performing one or more of: calibrating a temperature sensor within the processing chamber using the temperature, applying a temperature offset to one or more measurements of the temperature sensor, adjusting a model of a process performed in the processing chamber, and adjusting a process parameter of the process performed in the processing chamber.

In yet another embodiment, a method of calibrating a temperature measurement within a processing chamber is described. The method includes performing a process operation on a reference substrate within the processing chamber. While performing the process operation, a first temperature of a substrate disposed within the processing chamber is measured using a first etalon assembly. The measuring the first temperature of the substrate includes passing a first light beam through a first etalon and a substrate forming a second etalon, intersecting the substrate with the first light beam, splitting the first light beam into a reflected second beam and a transmitted second beam using one of the first etalon or the second etalon, collecting one of the reflected second beam or the transmitted second beam using a radiation measurement device, and analyzing the reflected second beam or the transmitted second beam to determine the first temperature of the substrate. The method further includes measuring a second temperature of the substrate or a substrate support on which the substrate is disposed using a first temperature sensor, transmitting the first temperature and the second temperature to a controller, and calibrating a model within the controller using the first temperature and the second temperature.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of the present invention generally relate to temperature measurements and calibration in semiconductor processing chambers and specifically to non-contact temperature measurements by heterodyning radiation between two etalon-objects within or associated with the processing chamber. In some embodiments, one or both of the two etalon-objects are semiconductor substrates (e.g., silicon substrates). In other examples, one or both the substrates may be fabricated from other materials. In some embodiments, the two etalon-objections include a reference substrate and a sample substrate. In some embodiments, the two etalon-objects are at least partially transparent to radiation having a wavelength between about 400 nm and about 2000 nm, such as about 1000 nm to about 1700 nm. In some embodiments, each of the two etalon-objects have substantially uniform physical thickness (i.e., no more than about 10% deviation). In some embodiments, the two etalon-objections are closely matched (between about 1% and about 10% difference) in physical thickness, optical thickness, index of refraction, and/or relative orientation.

One of the many potential advantages of the embodiments of the present disclosure is that in situ etalon-object (e.g., a substrate such as a semiconductor wafer) temperature measurements may be made over a broad temperature range (e.g., from about −200° C. to about 700° C.) with high resolution. Another advantage includes enabling direct temperature measurements without dependence on emissivity or heat transfer issues that can arise from substrate proximity methods. Temperature measurements disclosed herein may be minimally or unaffected by background or stray radiation. Another advantage includes allowing more accurate temperature data for chamber design, testing, and/or maintenance. More accurate testing may be especially noticeable in systems having high background radiation and systems equipped to produce a plasma therein. Another advantage includes enabling increased temperature uniformity across a substrate during processing. For example, temperature measurements disclosed herein may be minimally or unaffected by emissivity variations of a sample substrate, with providing rapid and accurate local temperature feedback that allows process knobs to be turned to yield improved temperature and process uniformity. Another advantage includes improved chamber matching, and/or improved temperature control during processing. Embodiments of the present disclosure can thereby be useful in areas of materials processing where tighter control of process temperature enable fabrication of advanced (i.e., smaller node) devices and/or high volume manufacturing.

Figure 1:
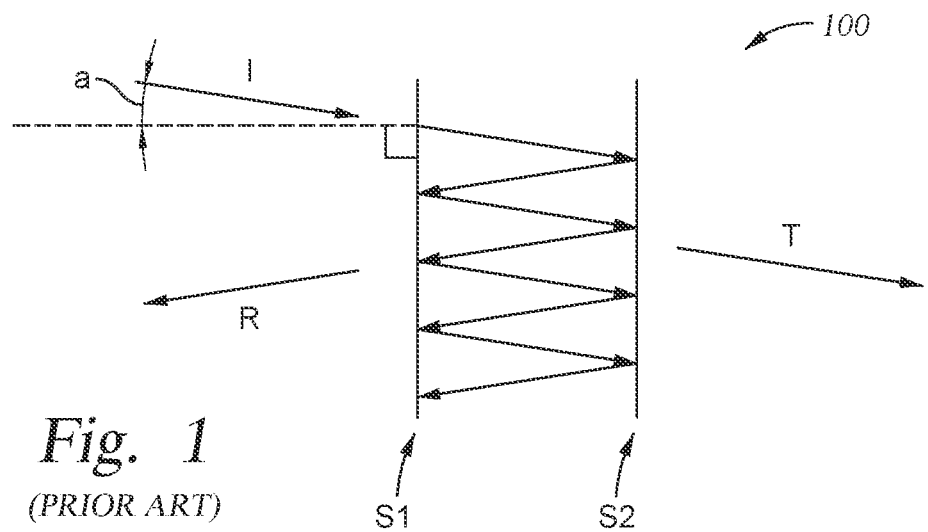
FIG. 1 illustrates an etalon and concepts related to etalons.

Relevant to techniques described herein, a substrate, such as a wafer, used in semiconductor processing is commonly made of silicon. As noted above, substrates fabricated from other materials may be utilized. The substrate may be shaped generally as a flat disk. The two flat surfaces of the disk (sometimes referred to as "front" and "back," "top" and "bottom", or "first" and "second") may be substantially parallel. In other words, the two surfaces of a substrate may form an etalon. As illustrated in FIG. 1, an etalon 100 is an optical element in which incident radiation I (e.g., infrared radiation) bounces back and forth between two surfaces $S_1$ and $S_2$. The incident radiation I may encounter the first surface $S_1$ at incidence angle α. The radiation may exit the etalon 100 as transmitted radiation T and/or reflected radiation R. Because of a high refractive index of the silicon semiconductor substrate, there is significant reflection between the two surfaces. With each reflection, there is a small loss of energy due to transmission. For the case of coherent radiation at a particular wavelength, the total transmitted power of the transmitted radiation T and the total reflected power of the reflected radiation R is a sensitive function of the optical thickness (the product of the refractive index and physical thickness) of the etalon 100. For example, transmitted power may be high for optical thicknesses corresponding to integer multiples of incident wavelength, and low for half-integer multiples of incident wavelength.

It should be appreciated that heterodyning techniques can be used in semiconductor processing with a variety of etalon-objects and materials. When the etalon-objects are silicon semiconductor substrates, a radiation source may be selected to produce coherent radiation over a broad wavelength spectrum from about 400 nm to about 2000 nm, such as about 1100 nm to about 1700 nm. Other materials, such as gallium arsenide, germanium, or sapphire, among others, may be used as etalon-objects in a semiconductor processing environment. In these cases, the wavelength range could be adjusted depending upon the transparency window of the particular objects and materials.

Figure 2:
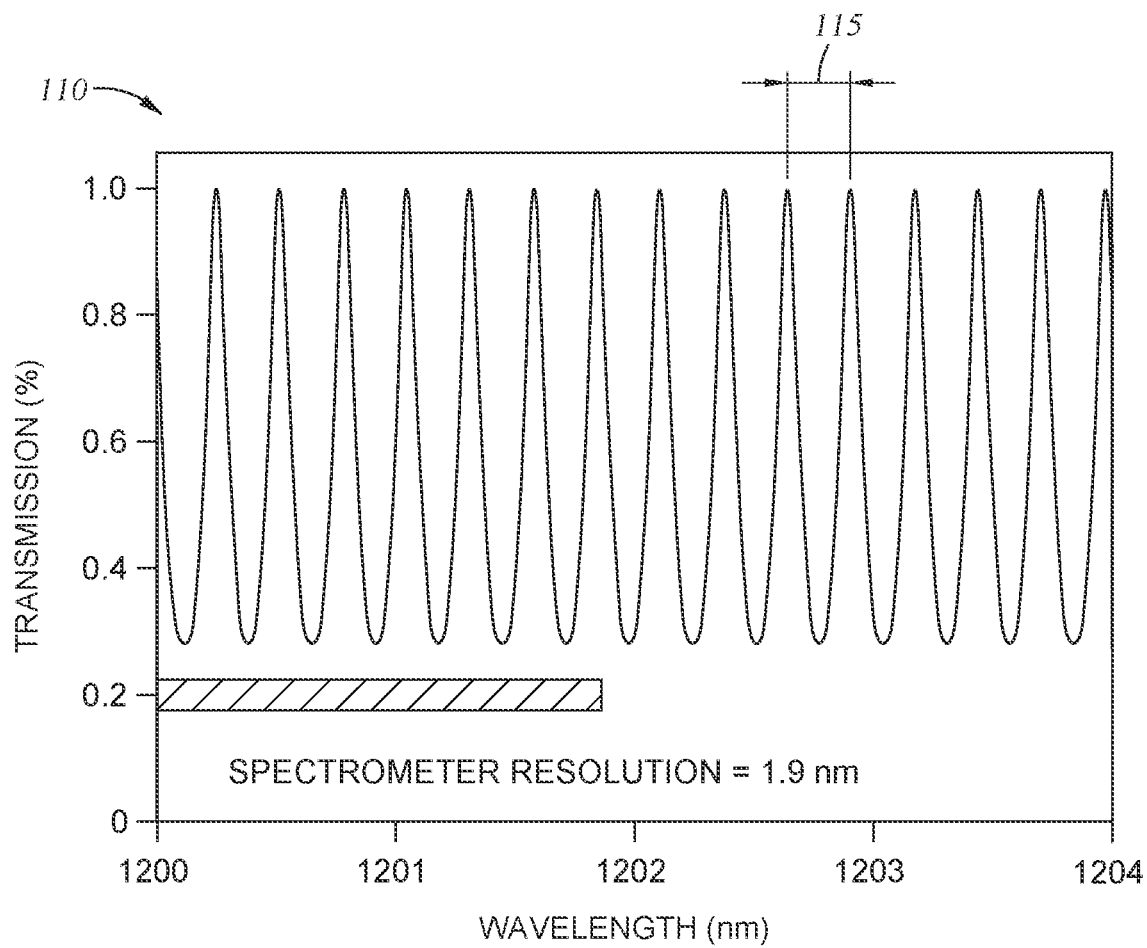
FIG. 2 illustrates a graph of transmission versus wavelength for standard-thickness silicon semiconductor substrates.

FIG. 2 illustrates a graph 110 of transmission versus wavelength for a standard-thickness (i.e., 0.775 mm) silicon substrate at room temperature with no absorption. It can be seen that reflections and transmissions interfere with each other constructively or destructively dependent on the wavelength and the optical thickness of the substrate. As illustrated, the fringe spacing 115 (e.g., distance between adjacent interference patterns, such as peaks or troughs) of 0.27 nm tends to be too narrow to be resolved by spectrometers typically incorporated into semiconductor tools. For example, one common spectrometer has a resolution of only 1.9 nm.

Figure 3:
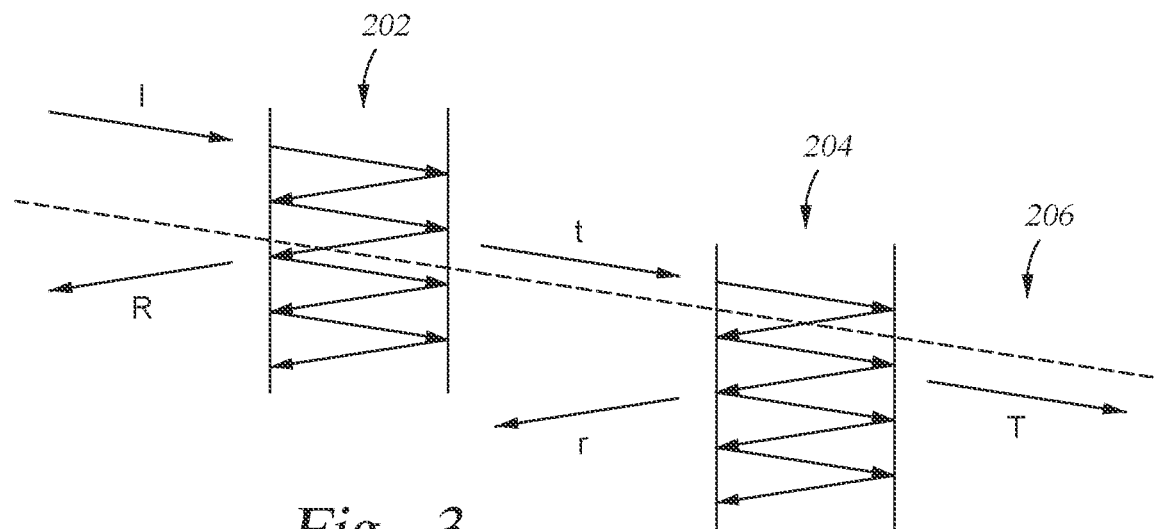
FIG. 3 illustrates a pair of etalon-objects aligned along an optical axis.

FIG. 3 illustrates a pair of etalon-objects 202 and 204 aligned along an optical axis 206. The etalon-objects 202, 204 may be silicon or other suitable substrates. As illustrated, incident radiation I (e.g., infrared radiation) encounters etalon-object 202, bouncing between the two surfaces thereof, and emerges as transmitted radiation t. Transmitted radiation t becomes incident radiation for a second etalon-object 204, bouncing between the two surfaces thereof, and emerging as transmitted radiation T or reflected radiation r. The radiation heterodynes (beats together) between the two etalons if the etalons are closely matched (between about 1% and about 10% difference). The two etalons are closely matched by controlling one or more of the refractive index, the physical thickness, the optical thickness, the relative orientation, and/or the incidence angle. As described herein, the two etalons are matched such that the optical thickness of both etalons are within about a 10% of one another. The optical thickness $T_{Optic}$ is derived from a combination of the refractive index RI, the physical thickness $T_{physical}$, and the angle of propagation $\theta$ within the etalon, such that $T_{Optic}=RI*T_{physical}*\cos(\theta)$. Therefore, any one of the refractive index, the physical thickness, and/or the angle of propagation may be varied to match the optical thickness of each etalon to within about a 10% difference.

Figure 4:
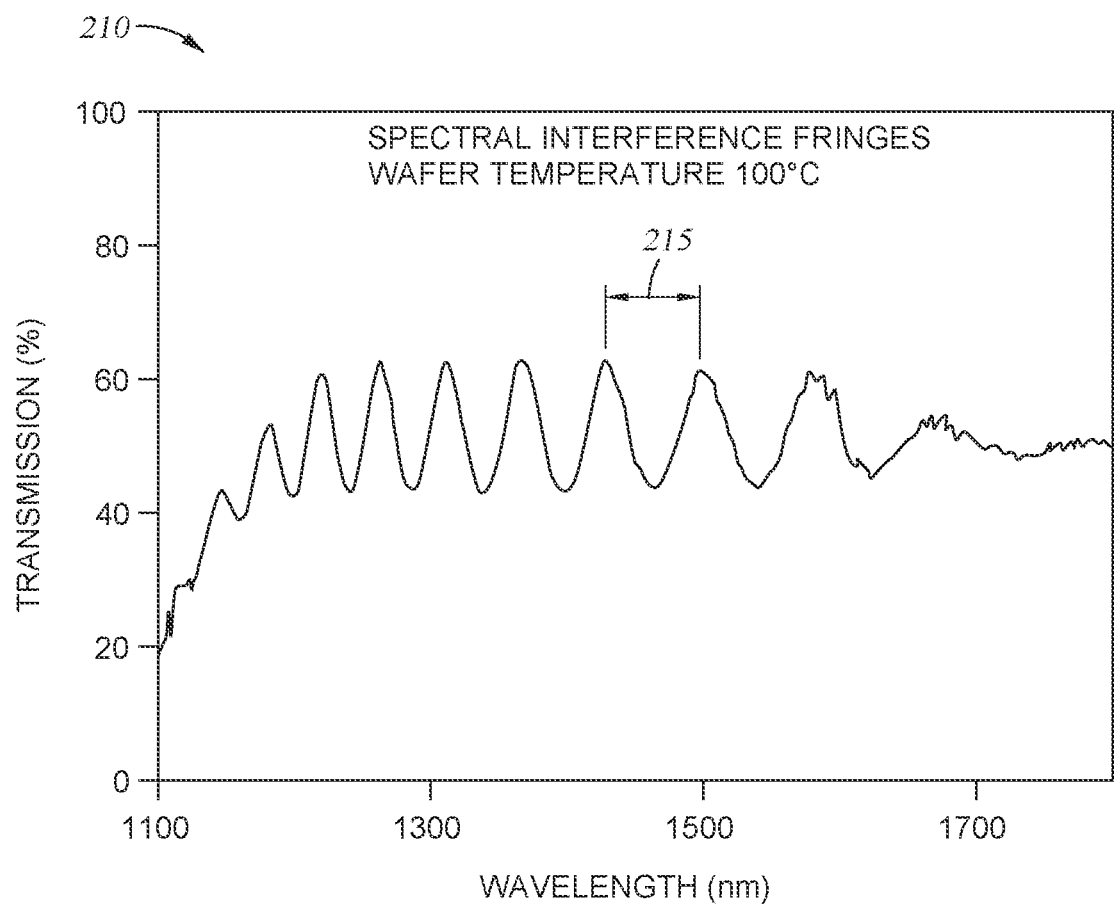
FIG. 4 illustrates another graph of transmission versus wavelength for a pair of standard-thickness silicon semiconductor substrates.

FIG. 4 illustrates a graph 210 of transmission versus wavelength for a pair of standard-thickness (i.e., 0.775 mm) silicon substrates, such as those shown in FIG. 3. In FIG. 4, the reference substrate is maintained at 25° C. while the sample is at 100° C. The reference substrate may be the second etalon-object 204 of FIG. 3. The graph 210 illustrates a heterodyned spectrum of the transmitted radiation T. The heterodyned spectrum has a fringe spacing generally wider than the fringe spacing of graph 110. For example, the fringe spacing 215 between selected adjacent interference peaks (proximal wavelength=1500 nm) is approximately 80 nm. Note that, unlike graph 110, the fringe spacing in graph 210 varies by wavelength. A similar heterodyned spectrum may be obtained using the transmitted radiation T. The heterodyned spectrum may be similar to a Moiré pattern. The two etalon-objects being heterodyned form overlapping intensity patterns similar to the intensity patterns produced by a Moiré interferometer. Similar to the intensity patterns of the Moiré interferometer, the intensity pattern generated using an etalon assembly changes as one or more characteristics, such as a refractive index, of one or both of the etalons within the etalon assembly changes.

Figure 5:
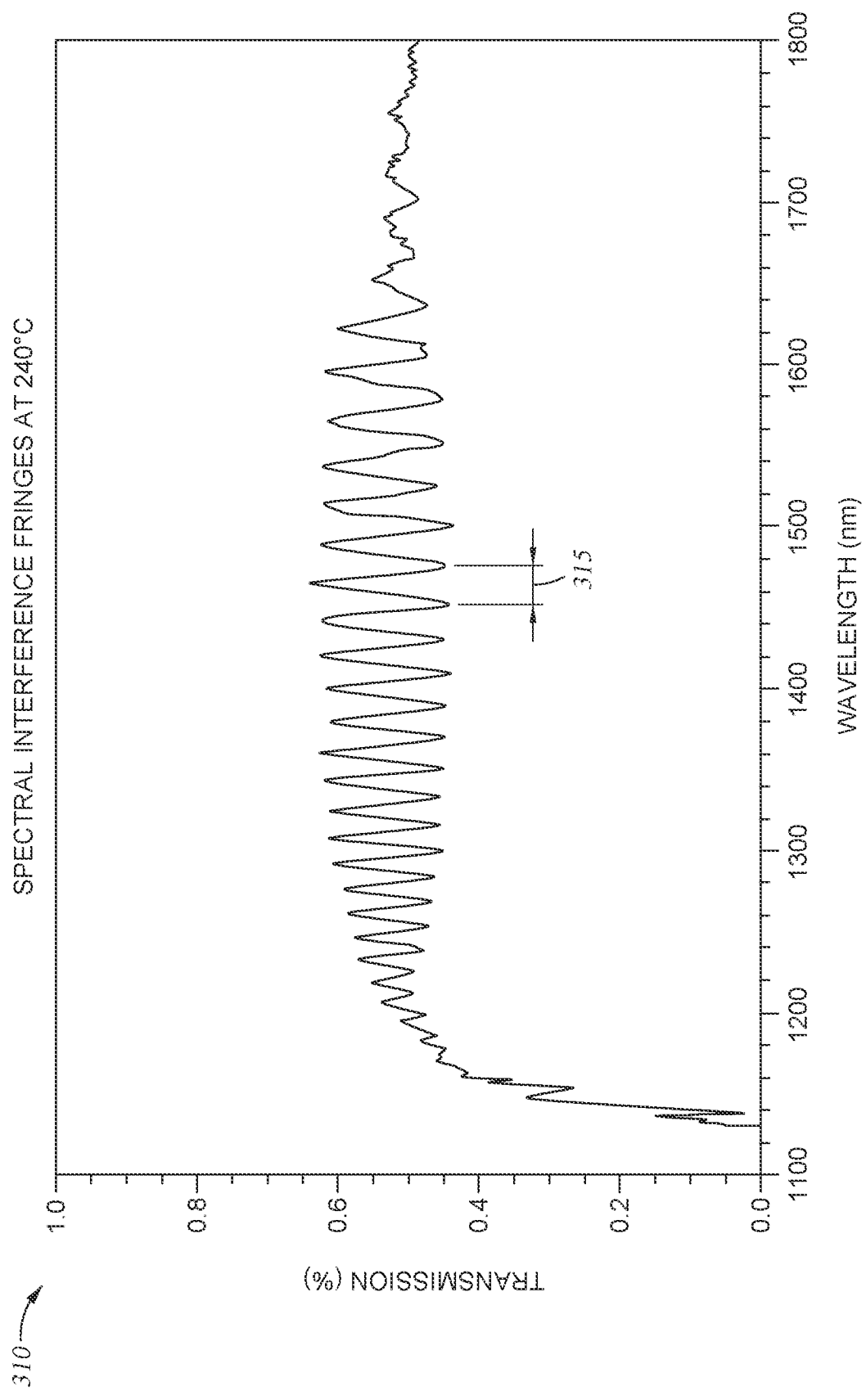
FIG. 5 illustrates another graph of transmission versus wavelength for a pair of standard-thickness silicon semiconductor substrates.

FIG. 5 illustrates another graph 310 of transmission versus wavelength for a pair of standard-thickness silicon substrates. In FIG. 5, the reference substrate is maintained at 25° C. while the sample is at 240° C. The graph 310 illustrates a heterodyned spectrum having a fringe spacing generally much wider than the fringe spacing of graph 110, but noticeably narrower than the fringe spacing of graph 210. For example, the fringe spacing 315 between selected adjacent interference troughs (proximal wavelength=1500 nm) is approximately 20 nm. The heterodyned spectrum of FIG. 5 may similarly be determined using one of the transmitted radiation T or the reflected radiation r.

It should be appreciated that concepts and techniques related to fringe spacing may be similarly applicable to interference pattern period counting. For example, in FIG. 4, the interference pattern exhibits about 3.25 periods in the wavelength range between 1300 nm and 1500 nm. Due to the narrower fringe spacing in FIG. 5, over the same wavelength range, the interference pattern exhibits about 10 periods. Therefore, period counting may be substituted for fringe spacing. Period counting may be beneficial at various operational conditions (e.g., high sample temperatures).

Likewise, it should be appreciated that concepts and techniques related to fringe spacing may be similarly applicable to interference pattern phase changes. For example, in FIG. 4, the interference pattern exhibits a phase of about pi/2 at a wavelength of about 1400 nm. In FIG. 5, at the same wavelength, the interference pattern exhibits a phase of about −pi/2. By changing the temperature of the reference substrate gradually from 100° C., as in FIGS. 4, to 240° C., as in FIG. 5, the phase of the interference pattern at the selected wavelength may be seen to progressively change. Therefore, phase changes with respect to temperature changes may be substituted for fringe spacing. Monitoring phase changes may be beneficial at various operational conditions (e.g., high and low sample temperatures). For example, substrate temperature may be substantially linearly related to the phase of the fringe pattern. This relationship may be established through the thermo-optic coefficient. In many cases, phase changes may be measured more accurately and/or efficiently than fringe spacing.

In some embodiments, the phase of the interference pattern may be monitored at a chosen wavelength. The chosen wavelength is a wavelength that is transmissive for the material of the substrate. For example, one chosen wavelength for a silicon substrate may be 1400 nm. Changes in phase at the chosen wavelength may be used to infer a change in temperature. For conditions of rapidly changing temperature, monitoring phase changes may improve the accuracy of temperature measurements. Monitoring phase changes may be done, in addition to, or in lieu of, measuring fringe spacing and/or phase changes.

As previously discussed, heterodyning occurs when the etalons are closely matched. For substantially parallel etalons having substantially the same physical thickness (less than about a 10% difference), heterodyning occurs when the etalons are closely matched in refractive index (less than about a 10% difference). The refractive index of typical etalon-objects (e.g., silicon substrates) associated with processing chambers varies with temperature. Consequently, for substantially parallel etalon-objects having substantially the same physical thickness, the extent of heterodyning (as indicated by the fringe spacing) varies with temperature. One of the etalon-objects, referred to as the "reference" etalon-object, may be maintained at a reference temperature. The other etalon-object may be referred to as the "sample" etalon-object. Thus, the fringe spacing can be used to calculate a difference in refractive index between the reference etalon-object and the sample etalon-object. The refractive index can then be used to infer the temperature of the sample etalon-object. It should be appreciated that known variations in relative incidence angle and/or physical thickness between the reference etalon-object and the sample etalon-object may be incorporated into the calculation of the refractive index and/or inferred temperature of the sample etalon-object.

In some embodiments, the reference etalon may be made of a different material than the sample etalon-object. In some embodiments, the reference etalon object may be made of a material having a refractive index that does not vary significantly with temperature. In such embodiments, the refractive index of the reference etalon-object may be known and/or estimated without specifically maintaining the reference temperature.

Figure 6:
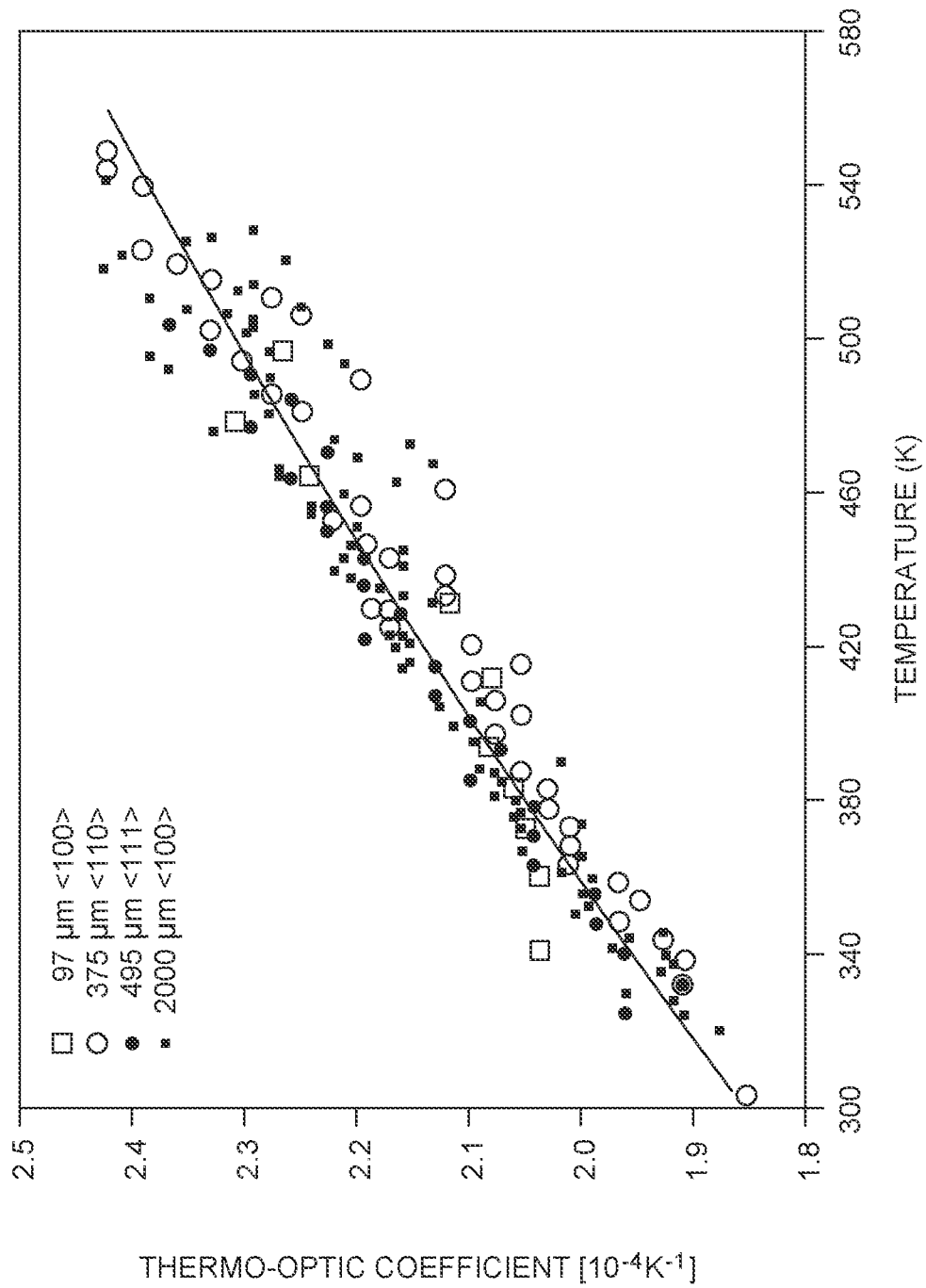
FIG. 6 illustrates a graph of thermo-optic coefficient versus temperature for a silicon semiconductor substrate from room temperature to about 300° C.

In some embodiments, the relationship between refractive index and temperature may be estimated or modeled. In some embodiments, the relationship between refractive index and temperature may be obtained through calibration. In some embodiments, a graph of thermo-optic coefficient (i.e., the change in refractive index versus temperature, dn/dT) may be used to estimate refractive index for a given temperature range. FIG. 6 illustrates a graph of thermo-optic coefficient versus temperature for a silicon semiconductor substrate from room temperature to about 300° C. Note that the refractive index on the vertical axis of FIG. 6 changes gradually with large temperature changes along the horizontal axis. Similar graphs of the thermo-optic coefficient may be formulated for other temperature ranges, such as cryogenic temperatures to about 600° C., such as about −200° C. to about 600° C.

The thermo-optic coefficient may also account for thermal expansion of the silicon semiconductor substrate. The thermal expansion of the silicon semiconductor substrate may be incorporated into a single optical thickness value, such that the optical thickness value depends upon both the thermal expansion and thermo-optic coefficients. The optical thickness values, which are correlated to specific temperature values, are determined in a manner which accounts for changes in a refractive index of the material as well as changes in a thickness of the substrate caused by thermal expansion. As the temperature of the substrate/etalon changes, both the refractive index as well as the physical thickness of the substrate/etalon will change. This affects the fringe spacing with respect to the correlated temperature. However, in embodiments described herein, the change in the optical thickness value as described herein is influenced to a greater degree by the change in the refractive index than the change in physical thickness. The refractive index of the material is correlated to a thermo-optic coefficient of the substrate material. The thermo-optic coefficient relates the change in the refractive index of the material to a change in temperature. The thermo-optic coefficient may be determined empirically for desired temperature ranges.

Figure 7:
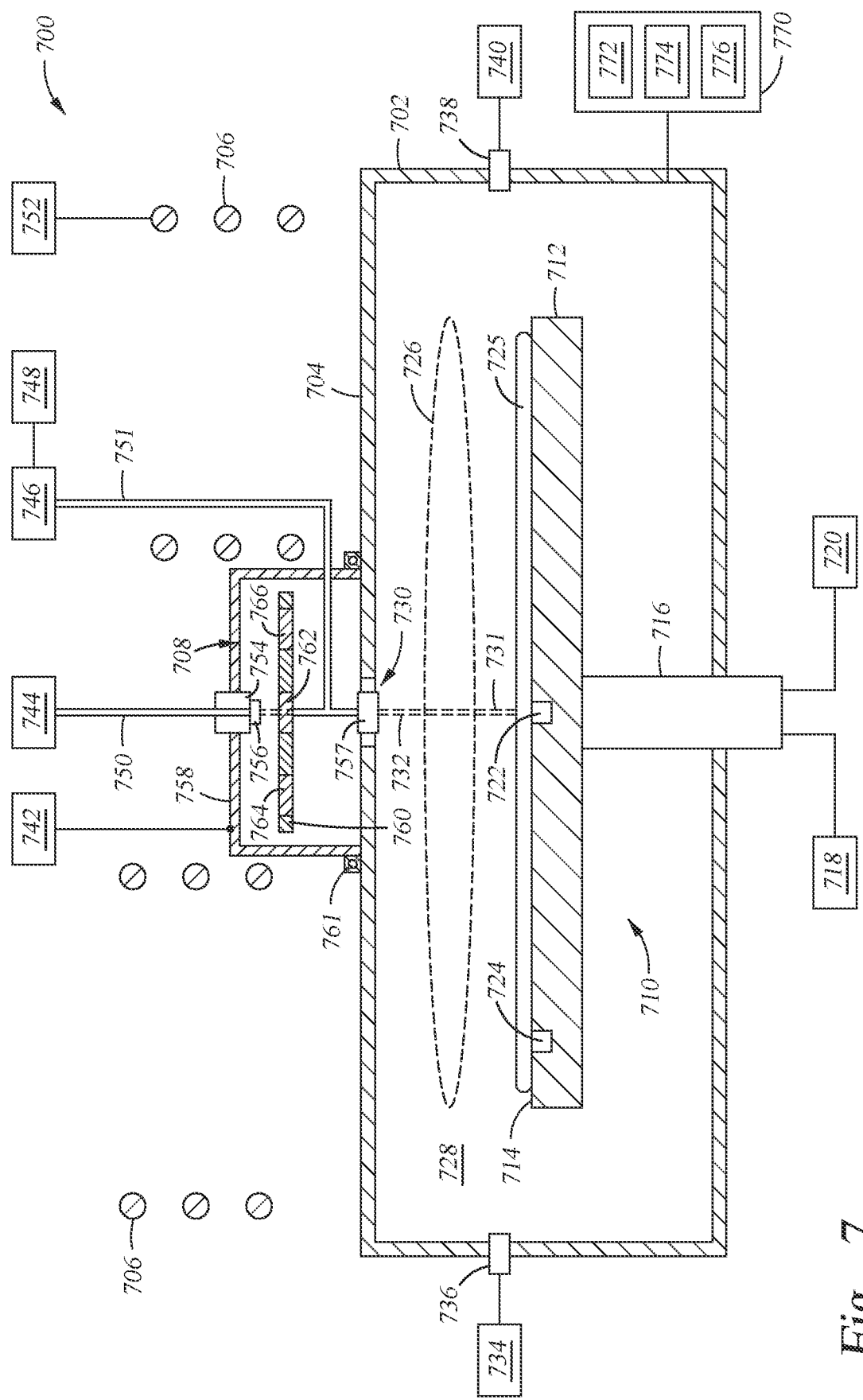
FIG. 7 illustrates a schematic illustration of a first process chamber, according to embodiments of the present disclosure.

FIG. 7 illustrates a schematic illustration of a first process chamber 700. The first process chamber 700 is configured to process a substrate, such as a semiconductor substrate therein. The first process chamber 700 includes a chamber body 702, a chamber lid 704 disposed on top of the chamber body 702, an etalon assembly 708 disposed on top of the chamber lid 704, and a substrate support 710 disposed within the chamber body 702. The chamber body 702 and the chamber lid 704 form a process volume 728 therein. A substrate 725, such as a semiconductor substrate, is disposed on top of the substrate support 710 within the process volume 728 and the etalon assembly 708 is configured to measure a temperature of the substrate 725.

The first process chamber 700 is configured to perform a plasma process, such as a plasma etch, ion implantation, a plasma deposition process or other plasma process, on the substrate 725 disposed within the process volume 728. A plasma 726 may be formed within the process volume 728 between the substrate support 710 and the chamber lid 704. One or more inductive coils 706 may be disposed above the chamber lid 704. The one or more inductive coils 706 are connected to a power source 752. The power source 752 may be an alternating current (AC) power source or a radio frequency (RF) power source. In some embodiments, the first process chamber 700 includes an inductively coupled plasma source (ICP), a capacitive coupled plasma source (CCP), and/or one or more other remote plasma sources.

One or more process gas sources 734 are fluidly coupled to the process volume 728 by one or more gas inlets 736. The process gas sources 734 may provide one or more process gases into the process volume 728. The process gases may include deposition precursors, inert gases, carrier gases, cleaning gases, etchant gases, or combinations thereof. The one or more process gases introduced by the process gas sources 734 may be removed using an exhaust pump 740. The exhaust pump 740 is in fluid communication with the process volume 728 via the exhaust openings 738. The exhaust openings 738 are formed through a portion of the chamber body 702.

In one example, substrate support 710 includes a substrate pedestal 712, a shaft 716, an actuator 718, and a power source 720. The substrate pedestal 712 includes a support surface 714. The support surface 714 is configured to support the substrate 725. Optionally, one or more temperature sensors 722, 724 are disposed within the substrate pedestal 712, such as a first temperature sensor 722 and a second temperature sensor 724. The first temperature sensor 722 is disposed in a central portion of the support surface 714 to measure a temperature of a central portion of the substrate 725 and/or a central portion of the substrate support 710 adjacent to the substrate 725. The second temperature sensor 724 is disposed radially outward from the first temperature sensor 722 on the support surface 714. The second temperature sensor 724 is configured to measure an edge temperature of the substrate 725 and/or the temperature of the substrate support 710 adjacent to the edge of the substrate 725.

The shaft 716 is connected to the substrate pedestal 712 and extends through the chamber body 702. The shaft 716 is connected to one or more actuators 718. The actuator 718 is configured to rotate the substrate support 710 and/or raise/lower the substrate support 710. The power source 720 is coupled to one or more resistive heaters (not shown) disposed in substrate pedestal 712. The resistive heaters are utilized to control the temperature of the substrate pedestal 712 and the substrate 725 disposed thereon. The power source 720 may also apply a voltage differential to the support surface 714. The temperature sensors 722, 724 may be coupled to power source 720 or a multimeter (not shown).

The etalon assembly 708 includes a reference etalon 762, a light source 744, a collimator 756 disposed between the light source 744 and the reference etalon 762, a radiation measurement device 746, and a spectral analyzer 748. The reference etalon 762 and the collimator 756 are disposed within an assembly body 758. The assembly body 758 prevents outside light and radiation from entering the etalon assembly 708 and is a casing for the etalon assembly 708. The assembly body 758 further serves to hold the reference etalon 762 and the collimator 756 in place during use of the etalon assembly 708.

A first light beam 732 is produced by the light source 744 and passes through one or more waveguides 750. The waveguides 750 may be optical fibers or light pipes. The waveguides 750 are configured to transmit the first light beam 732 from the light source 744 to the collimator 756 before the first light beam 732 is then transmitted to the reference etalon 762. The first light beam 732 is a broadband light beam and may produce a light spectrum over a large wavelength range, such as a wavelength range of about 400 nm to about 2000 nm, such as about 400 nm, to about 1400 nm, such as about 400 nm to about 800 nm. The broad spectrum light beam is a white light beam and is configured to contain light from a broad spectrum of wavelengths. The first light beam 732 is configured to pass through the collimator 756 and the reference etalon 762. After passing through the reference etalon 762, the first light beam 732 passes into a split waveguide 751. The split waveguide 751 is configured to transfer the first light beam 732 from the reference etalon 762 to the process volume 728 through an opening 730 within the chamber lid 704 or the chamber body 702. A second collimator, such as the second collimator 757, is disposed within the opening 730 and may be optically coupled to the split waveguide 751. The second collimator 757 is configured to collimate the light as it passes into the process volume 728. The opening 730 may be further configured to allow a process gas to be introduced into the process volume 728. The process gas may be introduced into an inner volume of the etalon assembly 708 by a second process gas source 742. The second process gas source 742 may introduce one or more process gases or an inert gas into the assembly body 758 of the etalon assembly 708. The one or more process gases may then be flowed into the process volume 728 via the opening 730.

In some embodiments, at least part of the opening 730 is covered with the second collimator 757. In some embodiments, the opening 730 is completely blocked using a window or the second collimator 757. The window separates the process volume 728 from the volume inside of the assembly body 758 and may assist in maintaining a constant temperature of the reference etalon 762.

The reference etalon 762 is held in place using an etalon housing 760. The etalon housing 760 is configured to hold one or more reference etalons in place. In the example of FIG. 7, the reference etalon 762, a second reference etalon 764, and a third reference etalon 766 are shown. In this embodiment, the reference etalon 762 may be referred to as a first reference etalon. Each of the reference etalon 762, the second reference etalon 764, and the third reference etalon 766 are disposed within the etalon housing 760. The etalon housing 760 is configured to reposition the etalons relative to the beam, such that a selected one of the reference etalons 762, 764, 766 may be move into the path of the first light beam 732. As shown in FIG. 7, the reference etalon 762 is disposed within the path of the first light beam 732. In some embodiments, the second reference etalon 764 and the third reference etalon 766 may be alternative reference etalons or alternative first etalons. The etalon housing 760 may be configured to rotate about an axis to switch which of the reference etalons 762, 764, 766 is incident with the first light beam 732. For example, the etalon housing 760 may be coupled to a stepper or servo motor that rotates the housing 760 to selectively move one of the etalons into the beam path. The etalon housing 760 may alternatively include either more or less reference etalons, such as only the first reference etalon 762, or only the first reference etalon 762 and the second reference etalon 764, or four or more reference etalons.

Each of the reference etalons 762, 764, 766 have a different thickness and/or a different refractive index. The different thickness and/or the different refractive index enable the reference etalons 762 764, 766 to be selected to match at least one of the refractive index and/or the thickness of the substrate 725. The thickness of the reference etalon incident with the first light beam 732 is changed by selecting one of the references etalons 762, 764, 766 which has the desired thickness. In some embodiments, the thickness of the reference etalon 762, 764, 766 within the first light beam 732 is selected to match the thickness of the substrate 725 to be within about a 10% difference of each other, such as less than about 15 μm difference, such as less than about 10 μm difference. Closely matching the thickness and/or the refractive index of the reference etalon 762, 764, 766 to the thickness of the substrate 725 enables heterodyning of the first light beam 732. In some embodiments, the reference etalons 762, 764, 766 may be selected manually by replacing one reference etalon from the etalon housing 760 with another reference etalon that has a thickness and/or refractive index match with the substrate 725.

Each of the reference etalons 762, 764, 766 are maintained at a pre-determined temperature using a temperature control unit 761. The temperature control unit 761 is coupled to the etalon assembly 708, such as being disposed around the assembly body 758. The temperature control unit 761 is configured to maintain a pre-determined temperature for at least the etalon incident with the light beam. For example, the temperature control unit 761 cools and/or heats the reference etalons. The temperature control unit 761 may control the temperature of the reference etalons using one or more coolant passages, fans, one or more resistive heaters, or combinations thereof. Maintaining a controlled temperature of the reference etalons 762, 764, 766 enables the etalon assembly 708 to precisely measure the temperature of the substrate 725 by allowing the temperature of the reference etalon 762, 764, 766 to be held constant and removing the reference etalon temperature as a variable that could introduce error.

The end of the waveguide 750, which is configured to introduce the first light beam 732 into the assembly body 758, is held in place by a waveguide jacket 754. The waveguide jacket 754 is a stiff jacket, such as a metal or thermoplastic jacket configured to hold the end of the waveguide 750 in place adjacent to the collimator 756 and the reference etalon 762. The waveguide jacket 754 has a stiffness that limits a bend radius of the waveguide 750 to greater than about 15 mm, such as greater than about 18 mm, such as greater than about 20 mm. Using a stiff waveguide jacket 754 has been shown to improve the consistency of optical measurements of the etalon assembly 708.

The radiation measurement device 746 is configured to measure one or more second light beams 731. The second light beams 731 may be a reflected second beam or a transmitted second beam. The second light beam 731 is generated from the first light beam 732 after the first light beam 732 passes through/is reflected off of the substrate 725. The substrate 725 serves as a second etalon. In some embodiments, the substrate 725 may be referred to as a sample etalon or a sample substrate. When the first light beam 732 intersects the substrate 725, the first light beam 732 is split into the transmitted second beam and the reflected second beam. The first light beam 732 may intersect the substrate 725 at a radial position similar to the radial position of one of the temperature sensors 722, 724. As shown in FIG. 7, the first light beam 732 intersects the substrate 725 at a similar radial position as the first temperature sensor 722.

The second light beam 731 described in FIG. 7 is a reflected second beam and passes through the process volume 728 back into the assembly body 758. The second light beam 731 is then collected into the split waveguide 751 and delivered to the radiation measurement device 746. The split waveguide 751 includes at least three openings. A first opening of the split waveguide 751 collects the first light beam 732 after passing through the reference etalon 762. A second opening of the split waveguide 751 collects the second light beam 731 after passing back through the second collimator. A third opening of the split waveguide 751 is optically coupled to the radiation measurement device 746. The third opening of the split waveguide 751 is configured to deliver one or a combination of the first light beam 732 and the second light beam 731 to the radiation measurement device 746.

The second light beam 731 which is delivered to the radiation measurement device 746 is measured and analyzed, such that the intensity and wavelength of the light delivered to the radiation measurement device 746 is determined. The radiation measurement device 746 may be a spectrometer or an array of spectrometers. The radiation measurement device 746 is capable of measuring heterodyned periods of the radiation. Methods described herein enable radiation measurement devices 746 to be utilized which have larger resolutions. Using radiation measurement devices 746 with larger resolutions may reduce the cost of measuring the fringe spacing as described herein. The radiation measurement device 746 may be capable of separately detecting, identifying, and/or measuring radiation from the one or more optical waveguides 750. For example, radiation measurement device 746 may include one or more selection devices (e.g., switches, optical chippers, or multi-beam splitters) capable of selecting between the optical waveguides 750. The radiation measurement device 746 may sequentially select one or more of the optical waveguides 750 for measurement.

The data collected by the radiation measurement device 746 is delivered to the spectral analyzer 748. The spectral analyzer 748 may be capable of receiving data from the radiation measurement device 746. In some embodiments, the spectral analyzer 748 may be capable of separately identifying and/or analyzing spectral data from the one or more optical waveguides 750. The spectral analyzer 748 may receive, process, store, and/or analyze data from one or more elements of the etalon assembly 708 to identify spectral interference fringe spacing, such as fringe spacing 215 in FIG. 4 and/or fringe spacing 315 in FIG. 5, to compute one or more optical thicknesses of the substrate 725, and/or to infer one or more temperature measurements of the substrate 725.

As should be appreciated with the benefit of this disclosure, the above configuration could be reconfigured to work in transmission mode. Transmission mode would include using the transmitted second beam instead of the reflected second beam. This embodiment may be advantageous for measuring a temperature of substrates which are non-reflective or oriented in a way that makes access to reflected radiation difficult. Exemplary transmission modes are provided in FIGS. 9B and 9C.

The light beam may also pass through the etalons in reverse order, such that the substrate 725 serves as a first etalon and the reference etalon 762 serves as a second etalon. In this embodiment, the first light beam 732 first passes through the substrate 725 before being passing through the reference etalon 762. Either of a transmitted or a reflected light which passes through the substrate 725 may be transmitted to the reference etalon 762.

A controller 770 is coupled to the first process chamber 700. The controller 770 is configured to facilitate the control and automation of the methods described herein. The controller 770 may be coupled to or in communication with the light source 744, the radiation measurement device 746, the spectral analyzer 748, the process gas sources 734, 742, the exhaust pump 740, the power sources 752, 720, and the actuator 718. The controller 770 may be in communication with or coupled to a CPU 772 (i.e., a computer system). The CPU 772 can be a hardware unit or combination of hardware units capable of executing software applications and processing data. In some configurations, the CPU 772 includes a central processing unit (CPU), a digital signal processor (DSP), an application-specific integrated circuit (ASIC), a graphic processing unit (GPU) and/or a combination of such units. The CPU 772 is generally configured to execute the one or more software applications and process stored media data. The controller 770 may include a memory 774. The memory is a non-transitory computer-readable medium for storing instructions of determining a temperature of a substrate as described herein. The CPU 772 may be one of any form of general purpose computer processor that can be used in an industrial setting, such as a programmable logic controller (PLC), for controlling various chambers and sub-processors. The memory 774 is coupled to the CPU 772 and the memory 774 is non-transitory and may be one or more of readily available memory such as random access memory (RAM), read only memory (ROM), floppy disk drive, hard disk, or any other form of digital storage, local or remote. Support circuits 776 are coupled to the CPU 772 for supporting the processor in a conventional manner. The temperature measurement and other processes are generally stored in the memory 774, typically as a software routine. The software routine may also be stored and/or executed by a second CPU (not shown) that is remotely located from the hardware being controlled by the CPU 772.

The memory 774 is in the form of computer-readable storage media that contains instructions, that when executed by the CPU 772, facilitates the operation of the first process chamber 700. The instructions in the memory 774 are in the form of a program product such as a program that implements the method of the present disclosure. The program code may conform to any one of a number of different programming languages. In one example, the disclosure may be implemented as a program product stored on computer-readable storage media for use with a computer system. The program(s) of the program product define functions of the embodiments (including the methods described herein).

In certain embodiments, the program(s) embody machine learning capabilities. Various data features include process parameters such as processing times, temperatures, pressures, voltages, polarities, powers, gas species, precursor flow rates, and the like. Relationships between the features are identified and defined to enable analysis by a machine learning algorithm to ingest data and adapt processes being performed by the first process chamber 700. The machine learning algorithms may employ supervised learning or unsupervised learning techniques. Examples of machine learning algorithms embodied by the program include, but are not limited to, linear regression, logistic regression, decision tree, state vector machine, neural network, naïve Bayes, k-nearest neighbors, K-Means, random forest, dimensionality reduction algorithms, and gradient boosting algorithms, among others. In one example, the machine learning algorithm is utilized to modulate temperature measurements of the substrate.

Illustrative computer-readable storage media include, but are not limited to: (i) non-writable storage media (e.g., read-only memory devices within a computer such as CD-ROM disks readable by a CD-ROM drive, flash memory, ROM chips or any type of solid-state non-volatile semiconductor memory) on which information is permanently stored; and (ii) writable storage media (e.g., floppy disks within a diskette drive or hard-disk drive or any type of solid-state random-access semiconductor memory) on which alterable information is stored. Such computer-readable storage media, when carrying computer-readable instructions that direct the functions of the methods described herein, are embodiments of the present disclosure.

Although the etalon assembly 708 is shown as being mechanically coupled to the top surface of the first process chamber 700, the etalon assembly 708 may also be a remote etalon assembly, such that only the split waveguide 751 and the second collimator 757 are disposed on top of/through the first process chamber 700.

Figure 8A:
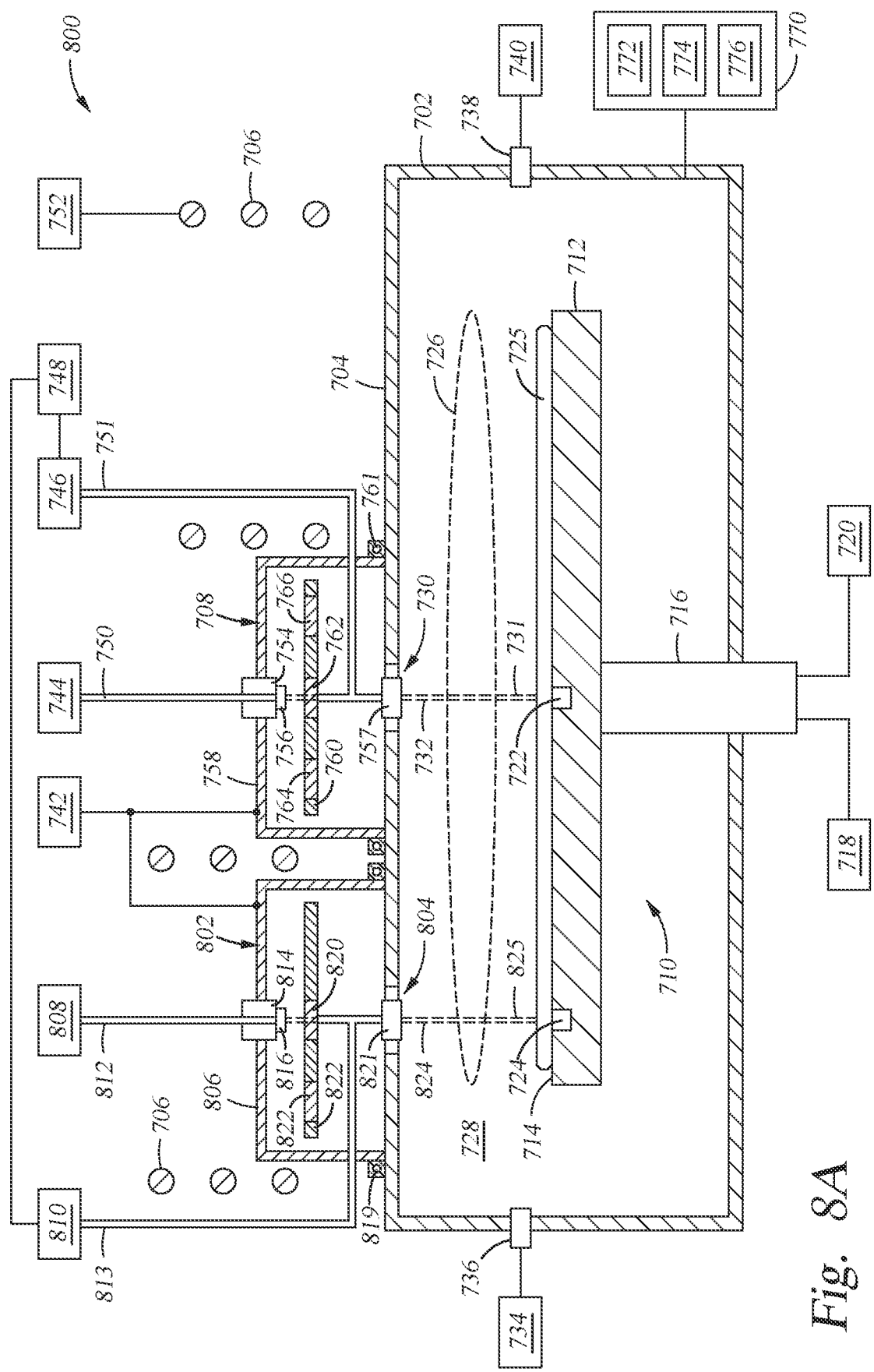
FIG. 8A illustrates a schematic illustration of a second process chamber, according to embodiments of the present disclosure.

FIG. 8A illustrates a schematic illustration of a second process chamber 800. The second process chamber 800 is similar to the first process chamber 700, but includes an additional second etalon assembly 802. The second etalon assembly 802 is similar to the etalon assembly 708, referred to as a first etalon assembly. The second etalon assembly 802 is configured to measure a temperature near the edge of the substrate 725, while the first etalon assembly 708 measures a temperature near the center of the substrate 725.

The second etalon assembly 802 includes a second assembly reference etalon 820, a second light source 808, a third collimator 816 disposed between the second light source 808 and the second assembly reference etalon 820, a second radiation measurement device 810, and the spectral analyzer 748. The second assembly reference etalon 820 and the third collimator 816 are disposed within a second assembly body 806. The second assembly body 806 prevents outside light and radiation from entering the second etalon assembly 802 and is a casing for the second etalon assembly 802. The second assembly body 806 further serves to hold the second assembly reference etalon 820 and the third collimator 816 in place during use of the second etalon assembly 802.

A third light beam 824 is produced by the second light source 808 and passes through one or more waveguides 812. The waveguides 812 may be optical fibers or light pipes. The waveguides 812 are configured to transmit the third light beam 824 from the second light source 808 to the third collimator 816 before the third light beam 824 is then transmitted to the second assembly reference etalon 820. The third light beam 824 is similar to the first light beam 732.

The third light beam 824 is configured to pass into a split waveguide 813. The split waveguide 813 is similar to the split waveguide 751 and is configured to transfer the third light beam 824 from the second assembly reference etalon 820 to the third collimator 816. After passing through the second assembly reference etalon 820, the third light beam 824 passes into the process volume 728 through an opening 804 within the chamber lid 704 or the chamber body 702. The opening 804 may further contain a fourth collimator 821, such that the fourth collimator 821 is configured to collimate the light as it passes into the process volume 728. The fourth collimator 821 is coupled to the split waveguide 813, such that the third light beam 824 passes from the second assembly reference etalon 820, into the split waveguide 813 and to the fourth collimator 821. The opening 804 may be further configured to allow a process gas to be introduced into the process volume 728. The process gas may be introduced into an inner volume of the second etalon assembly 802 by the second process gas source 742 or a third process gas source (not shown). In some embodiments, the third process gas source is the same as the second process gas source 742.

In some embodiments, at least part of the opening 804 is covered with the fourth collimator 821. In some embodiments, the opening 804 is completely blocked using a window or the fourth collimator 821. The window separates the process volume 728 from the volume inside of the second assembly body 806 and may assist in maintaining a constant temperature of the second assembly reference etalon 820.

The second assembly reference etalon 820 is held in place using a second etalon housing 818. The first light beam 824 is configured to pass through the second assembly reference etalon 820. The second etalon housing 818 is configured to hold one or more reference etalons in place, such as the second assembly reference etalon 820 and an alternate second assembly reference etalon 822. Each of the second assembly reference etalon 820 and the alternate second assembly reference etalon are disposed within the second etalon housing 818. The second etalon housing 818 is configured to reposition each of the second assembly reference etalons 820, 822 relative to the third light beam 824, such that a selected one of the second assembly reference etalons 820, 822 may be moved into the path of the third light beam 824. As shown in FIG. 8A, the second assembly reference etalon 820 is disposed within the path of the third light beam 824. The second etalon housing 818 may be configured to rotate about an axis to switch which of the second assembly reference etalons 820, 822 is incident with the third light beam 824. For example, the second etalon housing 818 may be coupled to a stepper or servo motor that rotates the second etalon housing 818 to selectively move one of the second assembly reference etalons 820, 822 into the beam path. The second etalon housing 818 may alternatively include either more or less reference etalons, such as only the second assembly reference etalon 820, or three or more reference etalons.

Similarly to the reference etalons 762, 764, 766, each of the second assembly reference etalons 820, 822 have a different thickness and/or a different refractive index. The different thickness or the different refractive index enable the second assembly reference etalons 820, 822 to be selected to match at least one of the refractive index and/or the thickness of the substrate 725. In some embodiments, the thickness of the second assembly reference etalons 820, 822 within the path of the third light beam 824 is selected to match the thickness of the substrate 725 to be within about a 10% difference of each other, such as less than about 15 μm difference, such as less than about 10 μm difference. Closely matching the thickness and/or the refractive index of the second assembly reference etalons 820, 822 to the thickness of the substrate 725 enables heterodyning of the third light beam 824. In some embodiments, the second assembly reference etalons 820, 822 may be selected manually by replacing one reference etalon from the etalon housing 818 with another reference etalon that has a thickness and/or refractive index match with the substrate 725. In embodiments described herein, the third light beam 824 intersects the substrate 725 at a radial location similar to the radial location of the second temperature sensor 724.

Each of the second assembly reference etalons 820, 822 are maintained at a pre-determined temperature using one or more second temperature control units 819. The second temperature control unit 819 is similar to the temperature control unit 761 and is configured to control the heating/cooling of the second assembly reference etalons 820, 822 of the second etalon assembly 802.

The end of the waveguide 812 which is configured to introduce the third light beam 824 into the second assembly body 806 is held in place by a waveguide jacket 814. The waveguide jacket 814 is similar to the waveguide jacket 754 and is configured to hold the end of the waveguide 812 in place adjacent to the second collimator 816.

The second radiation measurement device 810 is configured to measure one or more fourth light beams 825. The fourth light beams 825 may be a reflected fourth beam or a transmitted fourth beam. The fourth light beam 825 is generated from the third light beam 824 after the third light beam 824 passes through the substrate 725. The substrate 725 serves as a second etalon. In some embodiments, the substrate 725 may be referred to as a sample etalon. When the third light beam 824 intersects the substrate 725, the third light beam 824 is split into the transmitted fourth beam and the reflected fourth beam. The fourth light beam 825 described in FIG. 8A is a reflected fourth beam and passes through the process volume 728 back into the second assembly body 806. The fourth light beam 825 is then collected into the one or more waveguides 812 and delivered to the second radiation measurement device 810.

The fourth light beam 825, which is delivered to the second radiation measurement device 810, is measured and analyzed, such that the intensity and wavelength of the light delivered to the second radiation measurement device 810 is determined. The second radiation measurement device 810 is similar to the radiation measurement device 746.

The data collected by the second radiation measurement device 810 is delivered to the spectral analyzer 748. The spectral analyzer 748 may be capable of receiving data from the second radiation measurement device 810.

The split waveguide 813 includes at least three openings. A first opening of the split waveguide 813 collects the third light beam 824 after passing through the reference etalon 813. A second opening of the split waveguide 813 collects the fourth light beam 825 after passing back through the fourth collimator 821. A third opening of the split waveguide 813 is optically coupled to the second radiation measurement device 810. The third opening of the split waveguide 813 is configured to deliver one or a combination of the third light beam 824 and the fourth light beam 825 to the second radiation measurement device 810.

In some embodiments, additional etalon assemblies are utilized to collect additional temperature measurements along the radius of the substrate 725. In some embodiments, the first etalon assembly 708 may include additional reference etalons, but only one light source 744. In embodiments with only one light source 744, the first light beam 732 may be split into multiple light beams either before or after passing through the reference etalon 762. In some embodiments, at least one light beam is directed at each region of the substrate associated with a temperature control zone, such as a heating zone or a cooling zone, of the substrate support which supports the substrate. Each of the temperature control zones are controlled individually using one or more heating elements or cooling elements. The one or more heating elements may include lamps, resistive heaters, or heated conduits. The one or more cooling elements may include cooling conduits. The multiple light beams may be directed from either a plurality of etalon assemblies or a single etalon assembly where the light beams are split before entering the process volume.

Figure 8B:
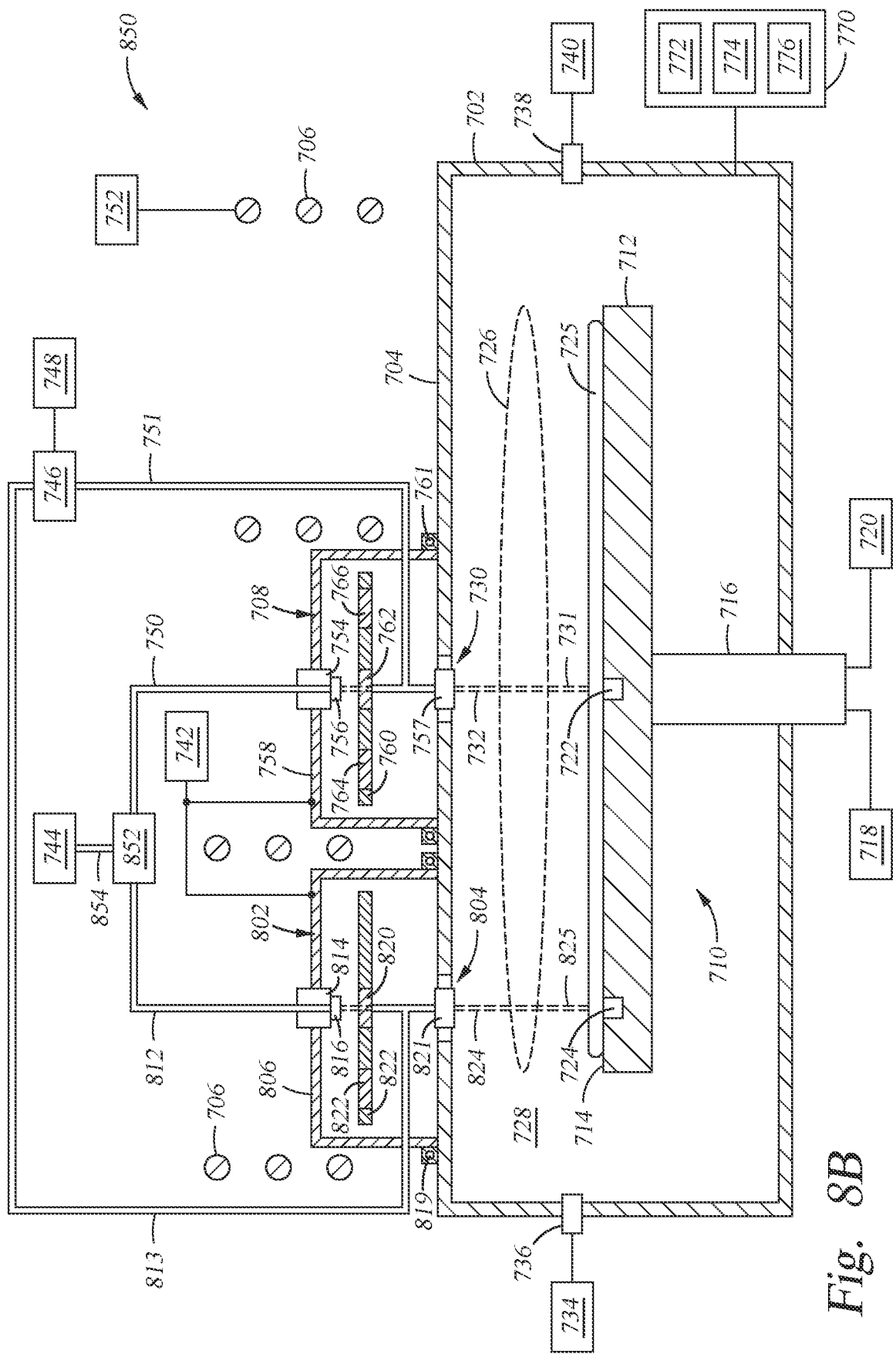
FIG. 8B illustrates a schematic illustration of a third process chamber, according to embodiments of the present disclosure.

FIG. 8B illustrates a schematic illustration of a third process chamber 850. The third process chamber 850 is similar to the second process chamber 800, but there is a single light source 744 and a single radiation measurement device 746. In the third process chamber 850, an optical splitter 852 is coupled between the light source 744 and each of the waveguides 750, 812 leading to the first etalon assembly 708 and the second etalon assembly 802. The optical splitter 852 includes one or more optical devices and is configured to split a primary light beam from the light source 744 into the first light beam 732 and the second light beam 824. The primary light beam is delivered to the optical splitter 852 from the light source 744 along a waveguide 854. Similarly, both of the split waveguides waveguides 751, 811 are coupled to the radiation measurement device 746. The third light beam 731 and the fourth light beam 825 are configured to be directed towards the radiation measurement device 746. The radiation measurement device 746 may therefore analyze the light beams 731, 825 simultaneously.

In some embodiments, only one etalon assembly is utilized, such as the first etalon assembly 708, but the first light beam is split into a first exiting light beam and a second exiting light beam before entering the process volume. The first exiting light beam and the second exiting light beam may be directed at different angles, such that the first exiting light beam intersects a center of the substrate while the second exiting light beam intersects the edge of the substrate.

Figure 9A:
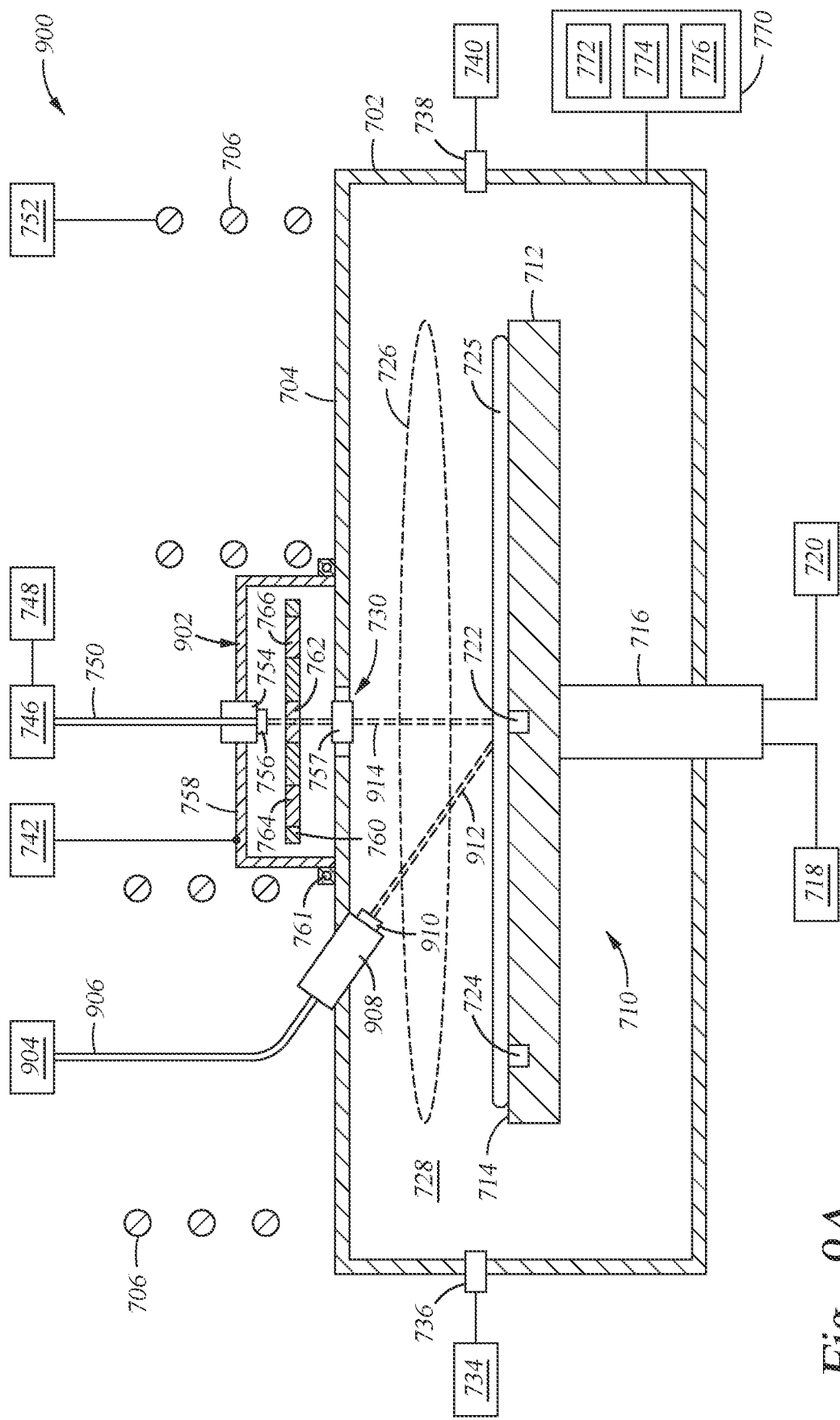
FIG. 9A illustrates a schematic illustration of a fourth process chamber, according to embodiments of the present disclosure.

FIG. 9A illustrates a schematic illustration of a fourth process chamber 900. The fourth process chamber 900 is similar to the first process chamber 700 of FIG. 7. The fourth process chamber 900 is different from the first process chamber 700 in that a first light beam 912 is configured to be incident on the substrate 725 before the reference etalons 762, 764, or 766. In the embodiment of FIG. 9A, the light source 904 is disposed separately from the etalon assembly 902. The etalon assembly 902 is similar to the etalon assembly 708 of FIG. 7, but does not include the light source 744. The light source 744 is replaced by the separately disposed light source 904.

The light source 904 is similar to the light source 744. The light source 904 is separately connected to a waveguide 906, a waveguide jacket 908, and a first light beam collimator 910. The waveguide 906 is similar to the waveguide 750, the waveguide jacket 908 is similar to the waveguide jacket 754, and the first light beam collimator 910 is similar to the collimator 756. The waveguide 906 is configured to transfer the first light beam 912 from the light source 904 to the collimator 756. The distal end of the waveguide 906 which intersects the chamber lid 704 and/or the chamber body 702 is held in place by the waveguide jacket 908. Before passing into the process volume 728, the first light beam 912 is transmitted through the first light beam collimator 910. The first light beam 912 is transmitted through the process volume 728 and intersects the substrate 725. The first light beam 912 as shown herein intersects the substrate 725 at an angle.

Once the first light beam 912 intersects the substrate 725, the first light beam 912 is transformed into a second light beam 914. The second light beam 914 is similar to the second light beam 731. The second light beam 914 is one of a transmitted second beam or a reflected second beam. In the embodiment of FIG. 9A, the second light beam 914 is a reflected second beam. The second light beam 914 is reflected back up through the opening 730 and into the etalon assembly 902 before the second light beam 914 intersects one of the reference etalons 762, 764, 766. The second light beam 914 is then heterodyned with the reference etalon, such as the reference etalon 762. After passing through the reference etalon 762, the second light beam 914 passes through the collimator 756 and into the radiation measurement device 746.

Figure 9B:
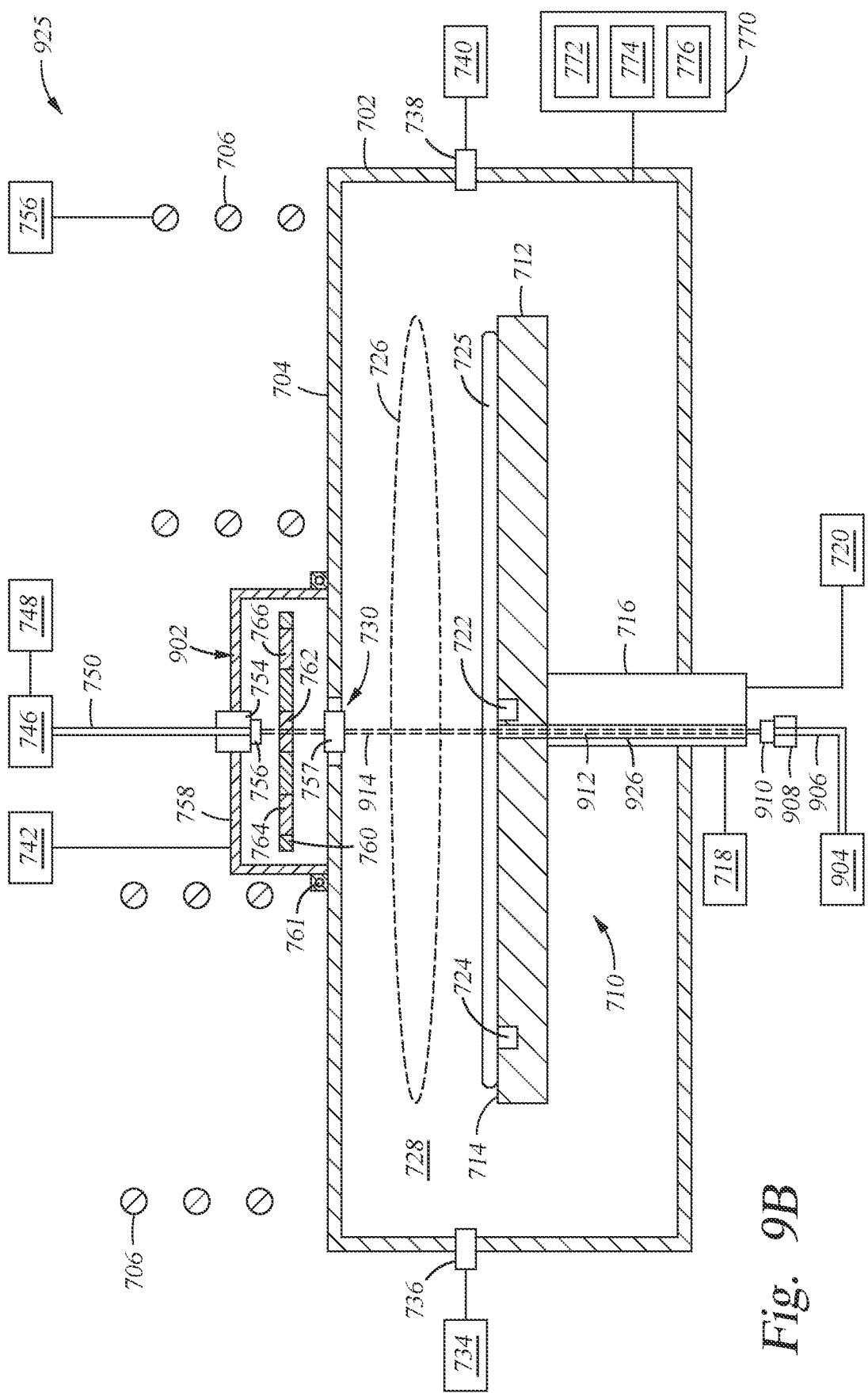
FIG. 9B illustrates a schematic illustration of a fifth process chamber, according to embodiments of the present disclosure.

FIG. 9B illustrates a schematic illustration of a fifth process chamber 925. The fifth process chamber 925 is similar to the fourth process chamber 900, but the light source 904 is configured to direct the first light beam 912 up through the substrate pedestal 712, through the substrate 725, and into the etalon assembly 902. In the fifth process chamber 925, the second light beam 914 is the transmitted light through the substrate 725. At least the waveguide jacket 908 and the light beam collimator 910 are disposed below or within the substrate pedestal 712 and/or the shaft 716, such that the waveguide jacket 908 and the light beam collimator 910 are disposed below the substrate pedestal 712 and the substrate 725.

The first light beam 912 is configured to pass through an opening 926 within the substrate pedestal 712 and the shaft 716. The opening 926 may optionally be filled with an optically transparent material, an optical fiber, or a waveguide. The first temperature sensor 722 may be positioned at a radial location similar to the location wherein the first light beam 912 passes through the substrate 725. The radial location of the intersection of the first light beam 912 with the substrate 725 and the radial location of the first temperature sensor 722 are off-center in the fifth process chamber 925. The opening 926 may be a hole or a slit through the substrate pedestal 712 and enables light to pass therethrough.

Figure 9C:
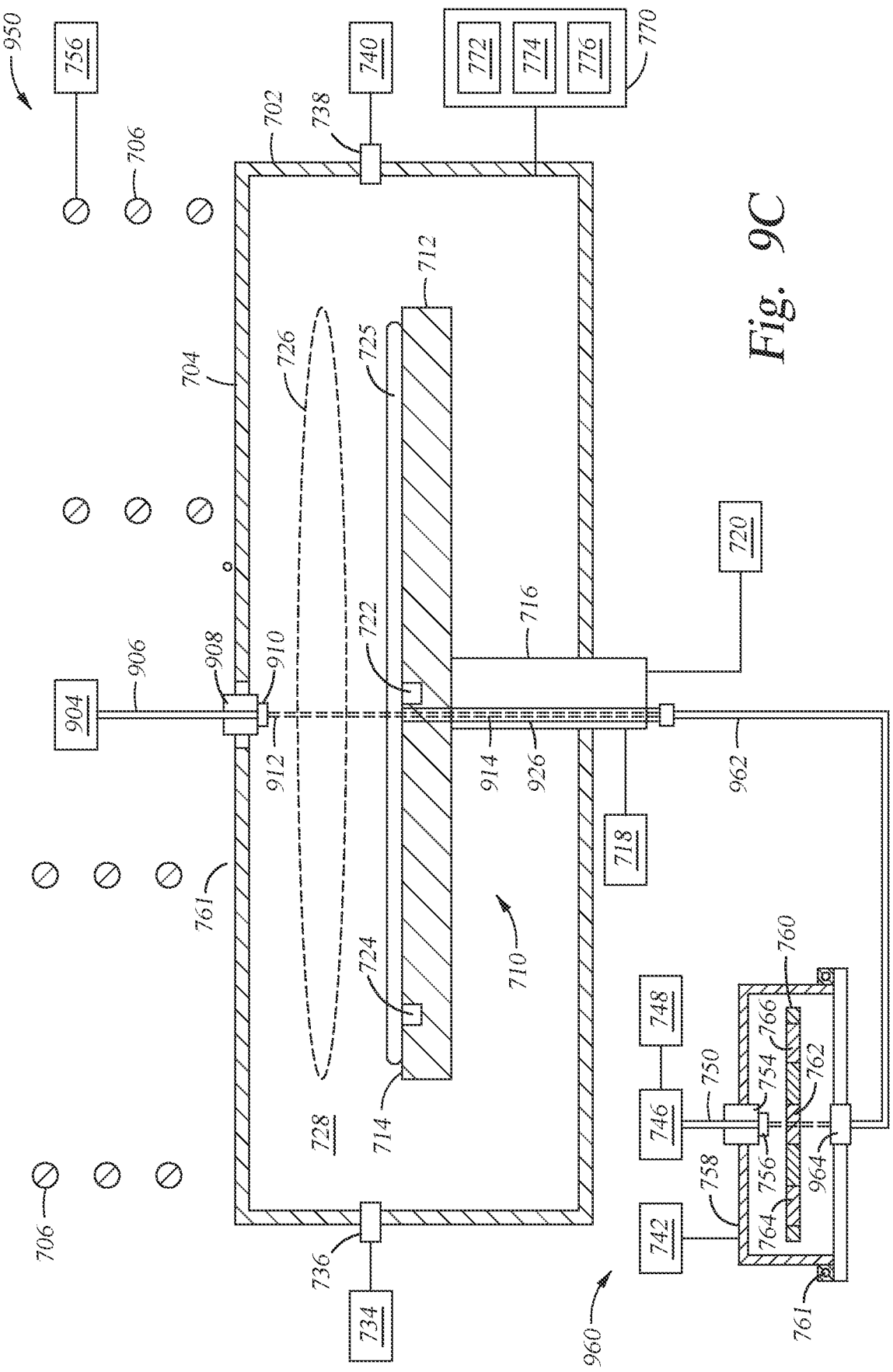
FIG. 9C illustrates a schematic illustration of a sixth process chamber, according to embodiments of the present disclosure.

FIG. 9C illustrates a schematic illustration of a sixth process chamber 950. The sixth process chamber 950 is similar to the fifth process chamber 925, but the etalon assembly 902 is replaced with the etalon assembly 960. The etalon assembly 960 is configured to receive a second light beam 914 after the second light beam 914 has passed through at least a portion of the substrate pedestal 712 and/or the shaft 714. The light source 904 is configured to direct the first light beam 912 down towards the substrate 725 from the chamber lid 704. The first light beam 912 is transmitted through the substrate 725 and through the opening 926 within the substrate pedestal 712 and the shaft 714 before passing through one of the reference etalons 762, 764, 766 of the etalon assembly 960. The etalon assembly 960 is optically coupled to the bottom of the chamber body 702 via a waveguide 962, while the waveguide jacket 908 and/or the light beam collimator 910 are disposed through the chamber lid 704. The second collimator 757 is replaced by a second collimator 764. The second collimator 764 is coupled to a distal end of the waveguide 962 furthest from the opening 926 and is sized to allow light/radiation passing through the waveguide 962 to enter the etalon assembly 960. The second collimator The sixth process chamber 950 is similar to the fifth process chamber 925 in that the second light beam 914 is transmitted through the substrate 725.

Figure 10:
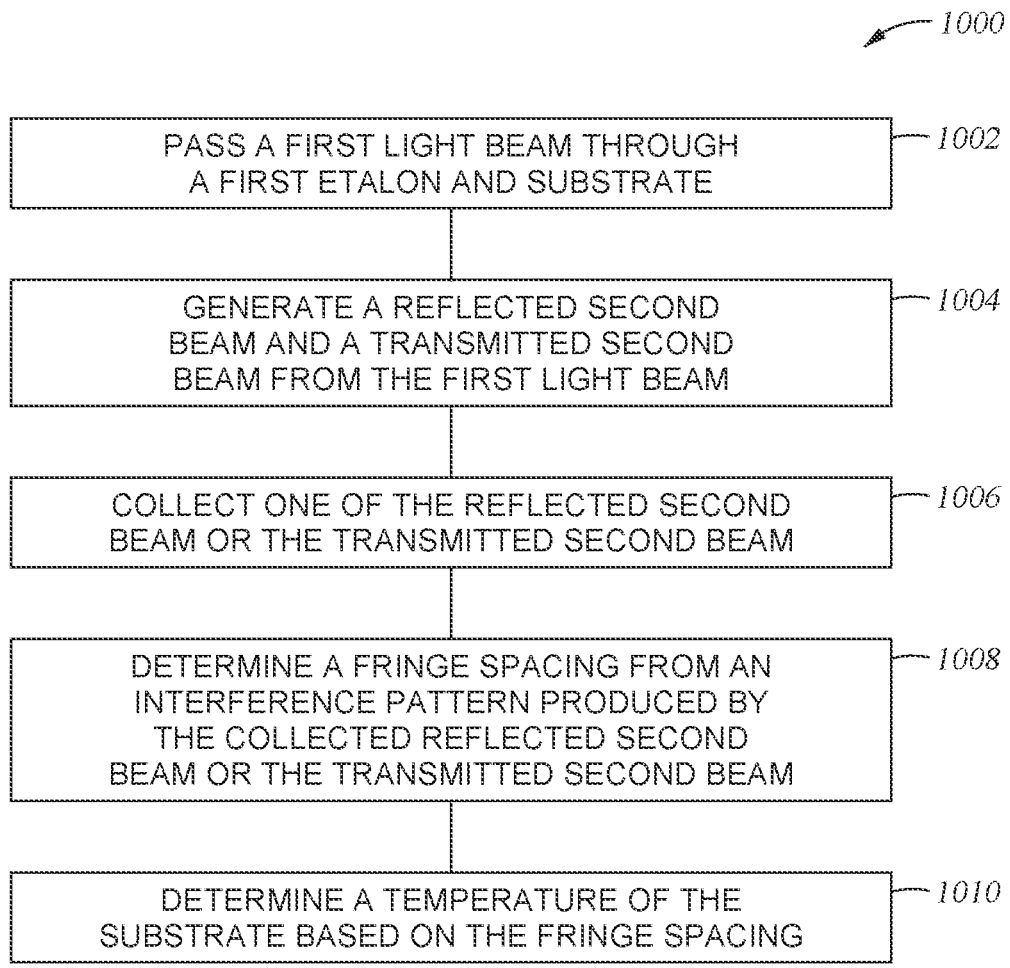
FIG. 10 illustrates a method of determining a temperature of a substrate, according to embodiments of the present disclosure.

FIG. 10 illustrates a method 1000 of determining a temperature of a substrate. The method 1000 may be utilized on any one of the first process chamber 700, the second process chamber 800, the third process chamber 850, the fourth process chamber 900, the fifth process chamber 925, the sixth process chamber 950, or another processing chamber or other location where accurate temperature control is desired. In one example, the method 1000 is stored as a software routine in the memory of the controller 770. When the method 1000 is executed by the controller 770, the controller 770 causes the temperature of the substrate 725 to be determined using the apparatus disclosed herein. The method 1000 uses a first etalon and a second etalon to determine the temperature of one of the second etalon. The first etalon may be a reference etalon while the second etalon is a sample etalon (i.e. a substrate). The first etalon and the second etalon are heterodyned to form an interference pattern. From the interference pattern, a fringe spacing may be measured to determine a temperature of the substrate.

At operation 1002 of the method 1000, a first light beam is passed through a first etalon and a substrate, wherein the substrate forms a second etalon. In one example, the first etalon is a reference etalon and the substrate is the sample etalon. The substrate may be a semiconductor substrate, such as the substrate 725 of FIGS. 7, 8A-8B, and 9A-9C.

The substrate as described herein is a sample substrate and is formed of a pre-determined material. The sample substrate is an additional substrate input into the process chamber for calibration processes. The sample substrate is configured to possess desired optical features, such as being optically transparent. The sample substrate may be optically transparent between the wavelengths of about 1000 nm to about 1800 nm, such as about 1100 nm to about 1700 nm. The sample substrate as described herein may be one of a silicon, a silicon oxide, a silicon nitride, a silicon carbide, or a silicon-germanium material. In some embodiments, the refractive index of the sample substrate is about 2 to about 6 over the wavelengths of about 1000 nm to about 1800 nm, such as about 3 to about 5.

The first etalon may be any one of the reference etalons 762, 764, 766, 820, 822 of FIGS. 7, 8A-8B, and 9A-9C. The first etalon and the substrate have a similar thickness and refractive index, such that the thickness of each of the first etalon and the substrate are matched to be within about a 10% difference. The first light beam may be similar to the light beams 732, 824, 912 of FIGS. 7, 8A-8B, and 9A-9C. The first light beam is a broad spectrum light beam. The first light beam may pass through either of the first etalon or the substrate first. In embodiments using apparatus similar to FIGS. 7, 8A, and 8B, the first light beam first passes through the first etalon. In embodiments using apparatus similar to FIGS. 9A-9C, the first light beam first passes through the substrate.

In embodiments wherein the first light beam first intersects the first etalon, the first light beam is then passed into a process volume and intersects the substrate to form a reflected second beam and a transmitted second beam from the first light beam during an operation 1004. The reflected second beam is the portion of the first light beam which is reflected by the substrate. The transmitted second beam is the portion of the first light beam which is transmitted through the substrate. Either one or both of the reflected second beam and the transmitted second beam form a second light beam. In the embodiments of FIGS. 7, 8A, and 8B, the second light beam is a reflected second beam.

In another embodiment, the first light beam passes into the process volume before first intersecting the substrate. After intersecting the substrate, the first light beam is split into a reflected second beam and a transmitted second beam during the operation 1004. The reflected second beam is the portion of the first light beam which is reflected by the substrate. The transmitted second beam is the portion of the first light beam which is transmitted through the substrate. Either one or both of the reflected second beam and the transmitted second beam form a second light beam. In the embodiments of FIG. 9A, the second light beam is a reflected second beam. The second light beam is then configured to intersect the first etalon, where the second light beam is either transmitted or reflected by the first etalon. In the embodiment of FIG. 9A, the portion of the second light beam which passes through the first etalon is transmitted to a radiation measurement device, such as the radiation measurement device 746. In the embodiments of FIGS. 9A and 9B, the second light beam is a transmitted second beam. The second light beam is then configured to intersect the first etalon, where the second light beam is either transmitted or reflected by the first etalon similarly to in FIG. 9A.

After the formation of the second light beam during the operation 1004, the second light beam is collected by the radiation measurement device using one or more waveguides, such as the waveguide 750, 812 during an operation 1006. The second light beam is collected by the radiation measurement device after intersecting both the first etalon and the substrate, such that the second light beam has been heterodyned by the first etalon and the substrate. The collection of the second light beam enables the second light beam to be analyzed by the radiation measurement device and the spectral analyzer. As described herein, the radiation measurement device may be a spectrometer or a plurality of spectrometers.

After the second light beam is transmitted to the radiation measurement device during the operation 1006, a fringe spacing of the second light beam is determined from an interference pattern during an operation 1008. The interference pattern is produced by the collected reflected second beam or the transmitted second beam and may be similar to the interference patterns of FIGS. 4 and 5. The fringe spacing may be determined using a spectral analyzer, such as the spectral analyzer 748. The spectral analyzer receives, processes, stores, and analyzes data provided by the radiation measurement device. The spectral analyzer identifies spectral interference fringe spacing, such as fringe spacing 215 of FIG. 4 and/or fringe spacing 315 of FIG. 5, to infer one or more temperature measurements of the substrate.

The fringe spacing determined during the operation 1008 is correlated to a temperature of the substrate. The temperature of the substrate is therefore determined based on the fringe spacing during operation 1010. The temperature is determined by matching the measured fringe spacing with a fringe spacing expected for a similar material at a specific temperature. In embodiments described herein, the spectral analyzer and/or a controller includes a reference table with fringe spacing correlated to temperature for specific materials and thicknesses. In some embodiments, the data is correlated to a graph, an equation, or a script, such that by knowing the fringe spacing, the temperature of the first etalon (reference etalon), the material of the substrate, and the physical thickness of the substrate, a temperature of the substrate may be determined at the point where the first light beam intersects the substrate.

When determining the temperature of the substrate during operation 1010 of the method 1000, the temperature of the first etalon, the material of the substrate, and the physical thickness of the substrate are utilized as constants while the fringe spacing changes with the temperature of the substrate. Therefore, once each of the temperature of the first etalon, the material of the substrate, the physical thickness of the substrate, and the fringe spacing of the substrate are known, a temperature is determined by the spectral analyzer and/or the controller. The look-up tables, reference table, or graphs utilized to correlate the fringe spacing to a temperature may be determined empirically over a desired temperature range. The empirically derived data may be obtained for specific materials at specific thicknesses and temperature ranges. In some embodiments, the empirical data is obtained for silicon, silicon oxide, silicon nitride, silicon carbide, and silicon-germanium. The refractive index of the sample substrate is about 2 to about 6 over the wavelengths of about 1000 nm to about 1800 nm, such as about 3 to about 5. The empirical data is correlated to cryogenic temperatures and/or temperatures from about −200° C. to about 700° C., such as about −196° C. to about 700° C., such as about −196° C. to about 500° C. The empirical data correlating the fringe spacing and the temperature account for both the thermo-optic coefficient of the substrate as well as any thermal expansion of the substrate as the substrate is raised or lowered in temperature. The thermal expansion may be passively accounted for in the empirical data by performing experiments which determine the total optical thickness of the substrate over a range of temperatures. The total optical thickness includes both the refractive index of the substrate as well as the thickness of the substrate.

For the method 1000 of FIG. 10, where the one or more temperature measurements of the substrate are determined, a physical thickness of the substrate is known before performing the method 1000. The physical thickness of the substrate may be determined using a separate thickness calibration process. The thickness calibration process may include manually measuring the temperature of the substrate using a caliper, micrometer, or a digital measurement tool. The thickness calibration process may alternatively include an etalon thickness calibration method, such as the method 1100 of FIG. 11. The method 1100 of FIG. 11 may utilize similar principles and apparatus to the method 1000 of FIG. 10.

Figure 11:
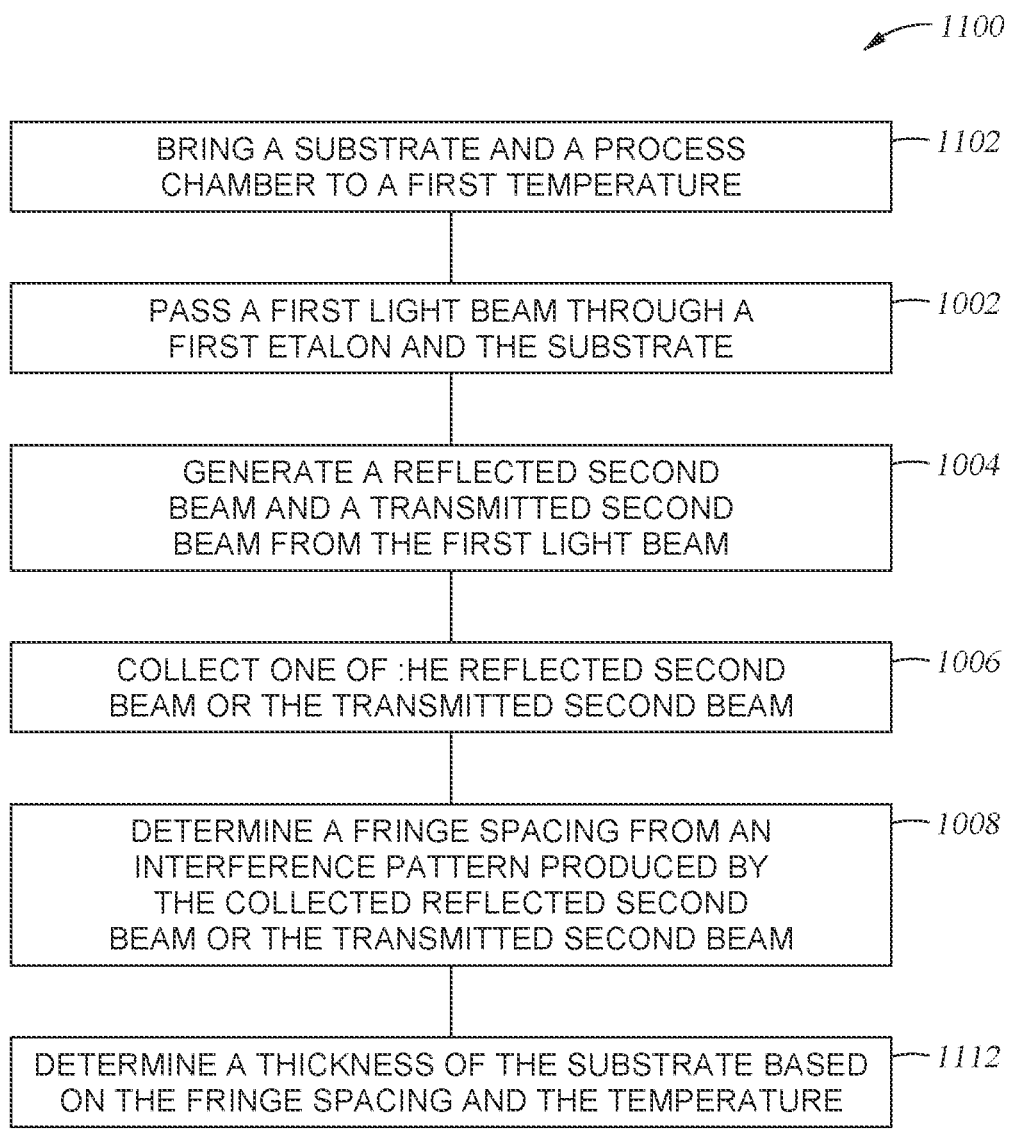
FIG. 11 illustrates a method of determining a thickness of a substrate, according to embodiments of the present disclosure.

FIG. 11 illustrates a method 1100 of determining the thickness of a substrate using an etalon assembly, such as the etalon assemblies 708, 802, 902, 960 of FIGS. 7, 8A-8B, 9A-9C, or other suitable etalon assembly. The method 1100 utilizes a first etalon and a substrate at a known temperature to determine a thickness of the substrate. During a method 1100 a substrate and a process chamber are brought to a first temperature during an operation 1102. The first temperature may be any suitable process temperature. In some embodiments, the first temperature is about room temperature. The substrate and the process chamber are maintained at the first temperature for a period of time which enables the substrate and the process chamber to be at steady state condition. One or more temperature sensors, such as the temperature sensors 722, 724 are utilized to measure the temperature of the substrate. When the temperature measurements of the temperature sensors have been steady for a pre-determined amount of time, the entire substrate, the substrate support, and process chamber may be determined to be at steady state. The temperature measurements of the temperature sensors may be utilized as the temperature of the substrate.

While at the first temperature, the operations 1002, 1004, 1006, 1008 of the method 1000 of FIG. 10 are performed. The operations 1002, 1004, 1006, 1008 of the method 1000 utilizes the etalon assembly to determine a fringe spacing caused by the substrate. Determining the fringe spacing is performed in a similar fashion to the method 1000 of determining the fringe spacing of FIG. 10. After the operations 1002, 1004, 1006, and 1008, a thickness of the substrate is determined during an operation 1112. The thickness of the substrate is determined utilizing the determined fringe spacing and the temperature of the substrate/process chamber.

The substrate as described in the method 1100 is a sample substrate and is formed of a pre-determined material. The sample substrate is configured to possess desired optical features, such as being optically transparent. The sample substrate may be optically transparent between the wavelengths of about 1000 nm to about 1800 nm, such as about 1100 nm to about 1700 nm. The sample substrate as described herein may be one of a silicon, a silicon oxide, a silicon nitride, a silicon carbide, or a silicon-germanium material. The refractive index of the sample substrate is about 2 to about 6 over the wavelengths of about 1000 nm to about 1800 nm, such as about 3 to about 5.

Using similar relationships to those discussed with respect to the method 1000, a thickness of the substrate may be determined using a look-up table and/or a graph, such that by knowing the fringe spacing, the temperature of the first etalon (reference etalon), the material of the substrate, and the temperature of the substrate, a thickness of the substrate may be determined at the point where the first light beam intersects the substrate. When determining the thickness of the substrate during operation 1112 of the method 1100, the temperature of the first etalon, the material of the substrate, and the temperature of the substrate are utilized as constants while the fringe spacing changes with the thickness of the substrate. Therefore, once each of the temperature of the first etalon, the material of the substrate, the temperature of the substrate, and the fringe spacing of the substrate are known, a thickness of the substrate is determined by the spectral analyzer and/or the controller.

Figure 12:
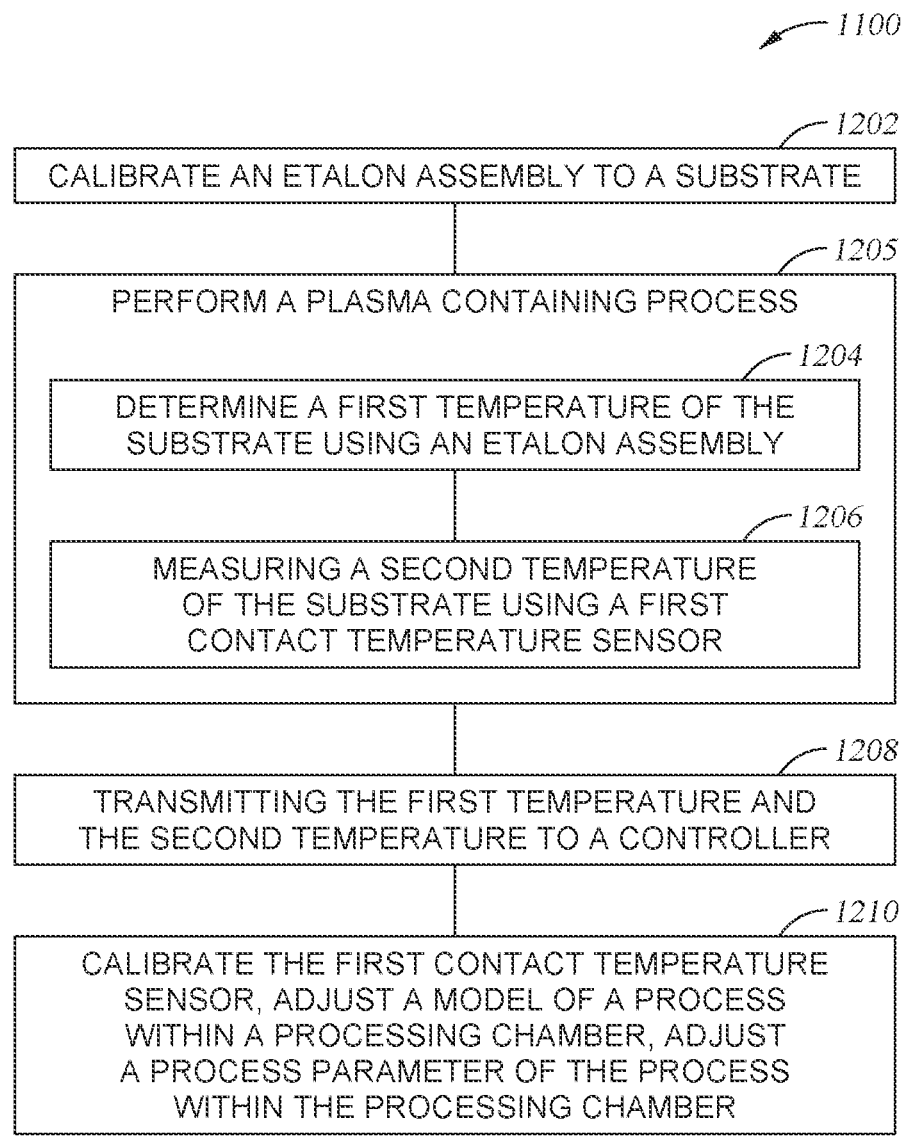
FIG. 12 illustrates a method of calibrating a temperature within a process chamber, according to embodiments of the present disclosure.

FIG. 12 illustrates a method 1200 of calibrating a temperature within a process chamber, such as one of the process chambers 700, 800, 850, 900, 925, 950 of FIGS. 7, 8A-8B, 9A-9C, or other suitable process chambers. During the method 1200 a temperature or temperature set is determined using one or more etalon assemblies, such as one of the etalon assemblies 708, 802, 902, 960. Calibrating the temperature may include any one or a combination of calibrating a temperature sensor within the processing chamber using the determined temperature, applying a temperature offset to one or more measurements of the temperature sensor, adjusting a model of a process performed in the processing chamber, and/or adjusting a process parameter of the process performed in the processing chamber.

During the method 1200, the etalon assembly is optionally calibrated for a specific substrate within the process chamber during an operation 1202. The calibration of the etalon assembly is performed to determine a thickness of the substrate disposed within the process chamber and to match the thickness of the substrate within the process chamber to the first etalon thickness utilized for later process operations. The operation 1202 includes the method 1100 and all of the operations 1102, 1002, 1004, 1006, 1008, 1112. Once the thickness of the substrate has been determined using the method 1100, the first etalon (i.e. reference etalon) may be adjusted or swapped to more closely match the thickness of the substrate. In embodiments described herein, the thickness of the substrate and the thickness of the first etalon are within about a 10% difference.

When using embodiments described herein, a first reference etalon, such as the first reference etalon 762, may be removed from the path of the first light beam and replaced by a second reference etalon or a third reference etalon, such as the second reference etalon 764 and the third reference etalon 766. The reference etalon is only changed if the original reference etalon thickness is outside of a predetermined percent difference, such as greater than 10%, with respect to the substrate. For example, substrates within a batch of substrates or between batches of substrates may have different thicknesses, and thus an appropriate different reference etalon would be switched into position in the etalon assembly. In some embodiments, the reference etalon is changed to a reference etalon with a percent difference of less than 8% with respect to the substrate, such as less than 5% with respect to the substrate. The reference etalon may be changed by actuating a carousel (for example, the etalon housing 760) containing multiple reference etalons or manually inserting a new reference etalon after removing the previous reference etalon.

In some embodiments, the method 1100 is performed multiple times within the method 1200, such that the method 1100 is performed a first time and the thickness of the substrate is determined to have a percent difference of greater than a predetermined threshold with respect to the reference etalon. The reference etalon is changed to a second reference etalon and the method 1100 is repeated a second time. If the thickness of the substrate is determined to have a percent different of less than the predetermined threshold with respect to the reference etalon, the operation 1202 is completed. If the thickness of the substrate is still determined to have a percent difference with respect to the second etalon outside of the threshold, the second reference etalon is replaced by a third reference etalon and the method 1100 is repeated a third time. This is performed until the percent different between the substrate and the reference etalon is below the threshold value.

After the operation 1202, a plasma containing process may be performed within the process chamber and on the substrate during operation 1205. The plasma containing process may be any one of a plasma etch process or a plasma deposition process. The plasma etch includes both conductor and/or dielectric etch. The deposition process includes one or more of chemical vapor deposition, sputtering deposition, and atomic layer deposition. Processes described herein are particularly well suited for processes which include a plasma, such as the plasma 726, within the process chamber. Processes described herein enable accurate measurement of substrate temperature within the process chamber while a plasma is formed within the process volume.

While the operation 1205 is being performed, a first temperature of the substrate is determined using the etalon assembly during an operation 1204 and a second temperature of the substrate, and/or a second temperature of the substrate support adjacent to the substrate, is determined using one or more temperature sensors, such as the first temperature sensor 722 or the second temperature sensor 724, during an operation 1206. The first temperature of the substrate is determined using the method 1000 of FIG. 10, such that the temperature determined based on the fringe spacing during operation 1010 of the method 1000 is the first temperature. During the operation 1010 of the method 1000, the thickness of the substrate may be input as the thickness determined using the operation 1202. The first temperature may be a single first temperature value or a first temperature data set, such as an array of single temperature values.

During the operation 1206, the one or more temperature sensors are disposed adjacent to the bottom surface of the substrate. The one or more temperature sensors measure the temperature of the bottom surface of the substrate and produce a single second temperature value or a second temperature data set, such as an array of single temperature values. The first temperature measurements and the second temperature measurements are taken simultaneously, such that the first temperature measurements and the second temperature measurements may be later compared.

During both the operation 1204 and the operation 1206, a process is performed on the substrate within the process chamber. In embodiments described herein, the process performed on the substrate is a semiconductor formation process and includes a plasma formed in the process volume. The process performed during the operation 1205 is similar to a process which would be performed within the process volume during normal operation. Using a similar process as during normal operation enables for a direct comparison between the temperatures measured by both of the etalon assembly and the one or more temperature sensors during operations 1204 and 1206. Being able to compare the process operations in both of the methods enables more accurate calibration or correction of one of the temperature sensors, the process model, and/or the process parameters.

After the first temperature and the second temperature are determined during the operations 1204 and 1206, the first temperature and the second temperature are transmitted to a controller during an operation 1208. In some embodiments, the first temperature and/or the second temperature are already determined within the controller and the data utilized to determine the first temperature and/or the second temperature is sent to the controller during the operations 1204 and 1206. The controller collects both the first temperature measurements and the second temperature measurements to enable comparison between the temperature measurements.

During an operation 1210, the first temperature and the second temperature are utilized to calibrate the process chamber. Calibrating the process chamber may include any one or a combination of calibrating a temperature sensor, such as the temperature sensors 722, 724, within the processing chamber using the determined temperature, applying a temperature offset to one or more measurements of the temperature sensor, adjusting a model of a process performed in the processing chamber, and/or adjusting a process parameter of the process performed in the processing chamber.

Calibrating the temperature sensor includes adjusting the temperature sensors to align with the first temperature measurements of the etalon assembly. In some embodiments, a single temperature offset may be applied to the measured second temperatures to more closely correlate to the first temperatures. In some embodiments, the model of the process performed in the processing chamber is adjusted to account for inaccurate or drifting second temperature measurements. In some embodiments, one or more of the process parameters of the process performed within the process chamber is changed, such that the results of the process are improved. The process parameter adjustment may be utilized for repetitive processes wherein similar results and inputs are expected between iterations.

Once the first temperature and the second temperature have been utilized to calibrate the process chamber during the operation 1210, the substrate may be removed from the process volume and the etalon assemblies may be optionally removed from the process chambers. The process chambers may subsequently be run normally to process substrates disposed therein. The apparatus and methods described herein may be utilized to re-calibrate the system periodically during maintenance procedures. The temperature measurement methods utilizing etalons as described herein, has been shown to be useful in processes which include plasma as the fringe spacing measured by the radiation measurement devices is not significantly influenced by the plasma. In some embodiments, additional collimators and/or filters are utilized within the systems described herein.

While the foregoing is directed to embodiments of the present disclosure, other and further embodiments of the disclosure may be devised without departing from the basic scope thereof, and the scope thereof is determined by the claims that follow.

What is claimed is:

1. A method of sensing temperature suitable for use in a semiconductor processing chamber, the method comprising:
    passing a first light beam through a first etalon;
    passing the first light beam through a substrate disposed in the processing chamber, the substrate providing a second etalon;
    generating a reflected second beam and a transmitted second beam from the first light beam after passing the reflected second beam through both of the first etalon and the second etalon;
    determining fringe spacing from an interference pattern of one of the reflected second beam or the transmitted second beam;
    determining a temperature of the substrate based on the fringe spacing; and
    calibrating a substrate temperature sensor of the processing chamber using the temperature determined based on the fringe spacing of the interference pattern.

2. The method of claim 1, wherein the fringe spacing is correlated to an empirically derived thermo-optic coefficient value of one of the first etalon or the second etalon.

3. The method of claim 1, wherein directing the first light beam through the first etalon and the substrate disposed in the processing chamber further comprises directing the first light beam to a surface of the substrate facing away from a lid of the processing chamber and in a direction towards the lid.

4. The method of claim 1, wherein directing the first light beam through the first etalon and the substrate disposed in the processing chamber further comprises directing the first light beam to a surface of the substrate facing a lid of the processing chamber and in a direction away from the lid.

5. The method of claim 1, wherein directing the first light beam from the first etalon to the substrate further comprises directing the first light beam through a plasma while a plasma process is performed on the substrate disposed within the processing chamber.

6. The method of claim 1, further comprising one or more of:
    calibrating a temperature sensor within the processing chamber using the temperature;
    applying a temperature offset to one or more measurements of the temperature sensor;
    adjusting a model of a process performed in the processing chamber; and
    adjusting a process parameter of the process performed in the processing chamber.

7. The method of claim 1, wherein before the determining the fringe spacing, the processing chamber and the substrate are brought to a steady state temperature and a thickness of the substrate is calculated using an initial substrate temperature measurement and a first thickness of the first etalon is adjusted to be within 10 μm of a second thickness of the substrate by moving the first etalon out of a path of the first light beam and placing an alternate first etalon in the path of the first light beam.

8. The method of claim 7, wherein placing the alternate first etalon in the path of the first light beam further comprises:
    automatically moving at least one of the first light beam and a first reference etalon of a plurality of reference etalons into alignment based on the thickness of the substrate.

9. The method of claim 1, further comprising:
    directing at least the first light beam and a third light beam to different locations of the substrate disposed in the processing chamber.

10. The method of claim 9, wherein directing the first light beam and the third light beam further comprises at least one of:
    directing the first light beam to a center region of the substrate and directing the third light beam to an edge region of the substrate; or
    directing at least one light beam to each region of the substrate associated with a temperature control zone of a substrate support supporting the substrate within the processing chamber.

11. A method of sensing temperature suitable for use in a semiconductor processing chamber, the method comprising:
passing a first light beam through a first etalon;
passing the first light beam through a substrate disposed in the processing chamber, the substrate providing a second etalon;
generating a reflected second beam and a transmitted second beam from the first light beam after passing the reflected second beam through both of the first etalon and the second etalon;
determining fringe spacing from an interference pattern of one of the reflected second beam or the transmitted second beam; and
determining a temperature of the substrate based on the fringe spacing,
wherein before the determining the fringe spacing, the processing chamber and the substrate are brought to a steady state temperature and a thickness of the substrate is calculated using an initial substrate temperature measurement and a first thickness of the first etalon is adjusted to be within 10 μm of a second thickness of the substrate by moving the first etalon out of a path of the first light beam and placing an alternate first etalon in the path of the first light beam.

12. The method of claim 11, wherein the fringe spacing is correlated to an empirically derived thermo-optic coefficient value of one of the first etalon or the second etalon.

13. The method of claim 11, wherein directing the first light beam through the first etalon and the substrate disposed in the processing chamber further comprises at least one of:
directing the first light beam to a surface of the substrate facing away from a lid of the processing chamber and in a direction towards the lid; or
directing the first light beam to a surface of the substrate facing a lid of the processing chamber and in a direction away from the lid.

14. The method of claim 11, wherein directing the first light beam from the first etalon to the substrate further comprises directing the first light beam through a plasma while a plasma process is performed on the substrate disposed within the processing chamber.

15. The method of claim 11, wherein placing the alternate first etalon in the path of the first light beam further comprises:
automatically moving at least one of the first light beam and a first reference etalon of a plurality of reference etalons into alignment based on the thickness of the substrate.

16. The method of claim 11, further comprising one or more of:
calibrating a temperature sensor within the processing chamber using the temperature;
applying a temperature offset to one or more measurements of the temperature sensor;
adjusting a model of a process performed in the processing chamber; and
adjusting a process parameter of the process performed in the processing chamber.

17. The method of claim 11, further comprising:
directing at least the first light beam and a third light beam to different locations of the substrate disposed in the processing chamber.

18. The method of claim 17, wherein directing the first light beam and the third light beam further comprises:
directing the first light beam to a center region of the substrate and directing the third light beam to an edge region of the substrate.

19. The method of claim 17, wherein directing further comprises:
directing at least one light beam to each region of the substrate associated with a temperature control zone of a substrate support supporting the substrate within the processing chamber.

* * * * *